US009354366B2

(12) United States Patent
Jain

(10) Patent No.: US 9,354,366 B2
(45) Date of Patent: *May 31, 2016

(54) RESONATOR-ENHANCED OPTOELECTRONIC DEVICES AND METHODS OF MAKING SAME

(71) Applicant: VerLASE Technologies LLC, Winooski, VT (US)

(72) Inventor: Ajaykumar R. Jain, San Carlos, CA (US)

(73) Assignee: VerLASE Technologies LLC, Bridgewater, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/665,707

(22) Filed: Mar. 23, 2015

(65) Prior Publication Data

US 2015/0192714 A1   Jul. 9, 2015

Related U.S. Application Data

(62) Division of application No. 14/114,318, filed as application No. PCT/US2012/030540 on Mar. 26, 2012, now Pat. No. 9,019,595.

(60) Provisional application No. 61/518,989, filed on May
(Continued)

(51) Int. Cl.
*H01S 5/00* (2006.01)
*G02B 5/20* (2006.01)
(Continued)

(52) U.S. Cl.
CPC ........ *G02B 5/20* (2013.01); *G02B 5/207* (2013.01); *H01L 31/02327* (2013.01);
(Continued)

(58) Field of Classification Search
CPC ............................. H01S 5/1092; H01S 5/1096
USPC ........................................................ 359/344
See application file for complete search history.

(56) References Cited

U.S. PATENT DOCUMENTS

| 5,351,256 A | 9/1994 | Schneider et al. |
| 6,160,828 A | 12/2000 | Kozlov et al. |

(Continued)

FOREIGN PATENT DOCUMENTS

| JP | 2007165880 | 6/2007 |
| JP | 2007173393 | 7/2007 |

(Continued)

OTHER PUBLICATIONS

Written Opinion and International Search Report dated Sep. 27, 2012, issued in connection with related PCT/US2012/030540 filed Mar. 26, 2012.
First Non-Final Office Action dated Sep. 18, 2014, issued in connection with related U.S. Appl. No. 14/114,318, filed Oct. 28, 2013.
Response to First Non-Final Office Action dated Dec. 18, 2014, issued in connection with related U.S. Appl. No. 14/114,318, filed Oct. 28, 2013.

(Continued)

*Primary Examiner* — Mark Hellner
(74) *Attorney, Agent, or Firm* — Downs Rachlin Martin PLLC

(57) ABSTRACT

Optical resonators that are enhanced with photoluminescent phosphors and are designed and configured to output light at one or more wavelengths based on input/pump light, and systems and devices made with such resonators. In some embodiments, the resonators contain multiple optical resonator cavities in combination with one or more photoluminescent phosphor layers or other structures. In other embodiments, the resonators are designed to simultaneously resonate at the input/pump and output wavelengths. The photoluminescent phosphors can be any suitable photoluminescent material, including semiconductor and other materials in quantum-confining structures, such as quantum wells and quantum dots, among others.

44 Claims, 26 Drawing Sheets

Related U.S. Application Data 16, 2011, provisional application No. 61/573,872, filed on Sep. 14, 2011, provisional application No. 61/628,955, filed on Nov. 10, 2011, provisional application No. 61/631,135, filed on Dec. 29, 2011.

(51) Int. Cl.
| | |
|---|---|
| *H01S 3/00* | (2006.01) |
| *H01S 3/082* | (2006.01) |
| *H01L 31/0232* | (2014.01) |
| *H01L 31/16* | (2006.01) |
| *H01S 5/10* | (2006.01) |
| *H01L 33/50* | (2010.01) |
| *B82Y 20/00* | (2011.01) |

(52) U.S. Cl.
CPC ........... *H01L 31/162* (2013.01); *H01S 3/0092* (2013.01); *H01S 3/082* (2013.01); *H01S 5/005* (2013.01); *H01S 5/10* (2013.01); *B82Y 20/00* (2013.01); *H01L 33/502* (2013.01); *H01S 5/1092* (2013.01); *H01S 5/1096* (2013.01); *Y10S 977/755* (2013.01); *Y10S 977/774* (2013.01)

(56) References Cited

U.S. PATENT DOCUMENTS

| | | | |
|---|---|---|---|
| 6,807,211 | B1 | 10/2004 | Cok et al. |
| 9,019,595 | B2 * | 4/2015 | Jain .................. H01S 5/005 359/344 |
| 2004/0179566 | A1 | 9/2004 | El-Bahar |
| 2005/0195873 | A1 | 9/2005 | Forrest et al. |
| 2005/0264715 | A1 | 12/2005 | Kahen et al. |
| 2009/0323751 | A1 | 12/2009 | Ji et al. |

FOREIGN PATENT DOCUMENTS

| | | |
|---|---|---|
| JP | 2008502924 | 1/2008 |
| JP | 2009540593 | 11/2009 |
| WO | 0247223 A1 | 6/2002 |
| WO | 2010027581 A1 | 3/2010 |

OTHER PUBLICATIONS

Notice of Allowance dated Mar. 4, 2015, issued in connection with related U.S. Appl. No. 14/114,318, filed Oct. 28, 2013.

Pellandini, P. et al.; Dual-wavelength laser emission from a couples semiconductor microcavity; Applied Physics Letters, American Institute of Physics, US; vol. 71, No. 7, Aug. 18, 1997, p. 864.

European Search Report dated Jun. 3, 2015, in connection with related EP12785990.

* cited by examiner

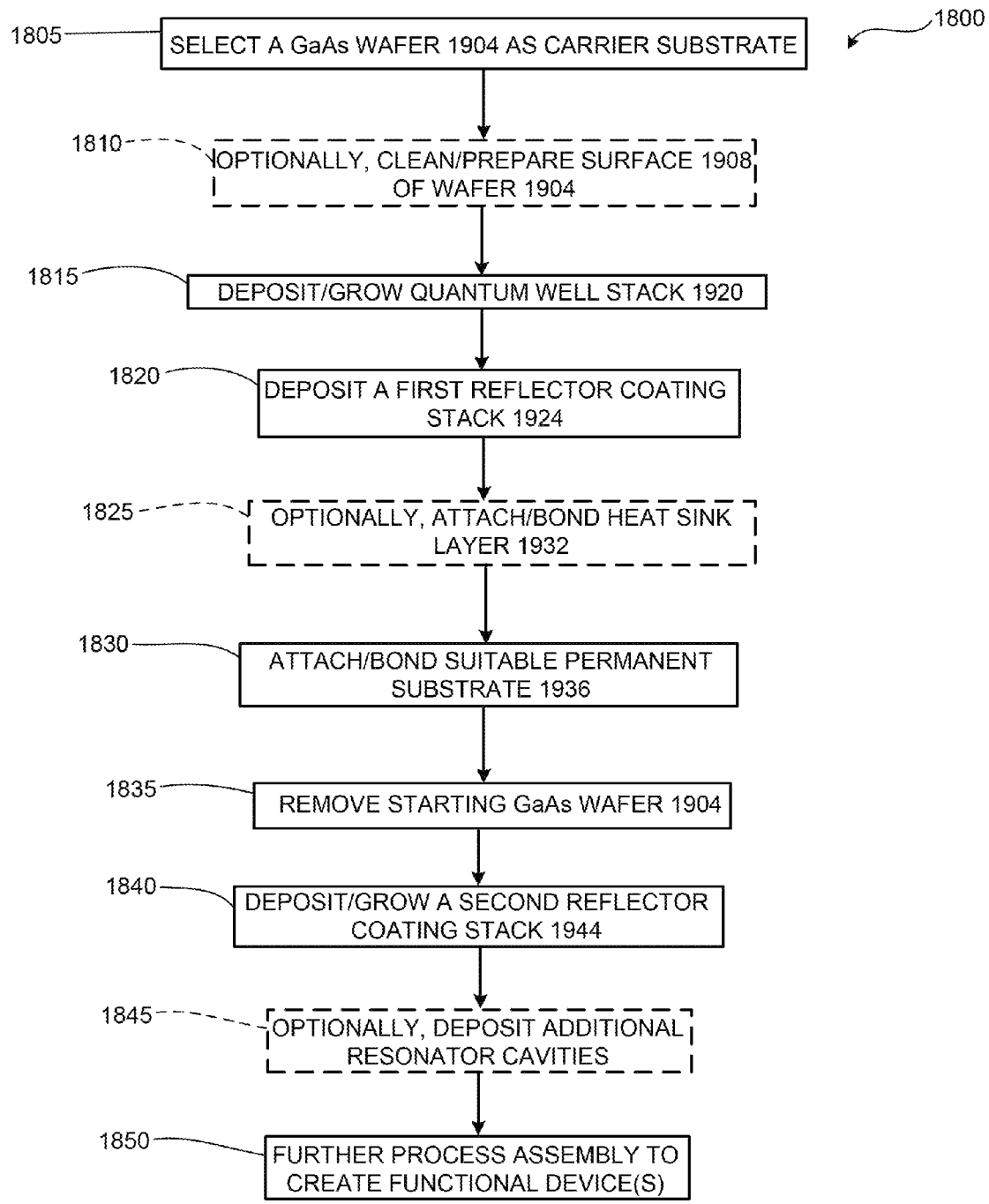

US 9,354,366 B2

RESONATOR-ENHANCED OPTOELECTRONIC DEVICES AND METHODS OF MAKING SAME

RELATED APPLICATION DATA

This application is a divisional of U.S. Nonprovisional patent application Ser. No. 14/114,318, filed on Oct. 28, 2013, and titled "Resonator-Enhanced Optoelectronic Devices and Methods of Making Same"; which application was a 371 application of International Patent Application PCT/US12/30540, filed on Mar. 26, 2012, entitled "Resonator-Enhanced Optoelectronic Devices and Methods of Making Same", which claims the benefit of priority of: U.S. Provisional Patent Application Ser. No. 61/518,989, filed on May 16, 2011, and titled "New and Novel Methods to Increase the Efficiency of Opto-Electronic Devices"; U.S. Provisional Patent Application Ser. No. 61/573,872, filed on Sep. 14, 2011, and titled "New and Novel Methods to Increase the Efficiency of Opto-Electronic Devices"; U.S. Provisional Patent Application Ser. No. 61/628,955, filed on Nov. 10, 2011, and titled "New and Novel Methods to Increase the Efficiency of Opto-Electronic Devices"; and U.S. Provisional Patent Application Ser. No. 61/631,135, filed on Dec. 29, 2011, and titled "New and Novel Methods to Increase the Efficiency of Opto-Electronic Devices". Each of the foregoing applications is incorporated by reference herein in its entirety.

FIELD OF THE INVENTION

The present invention generally relates to the field of optoelectronic devices. In particular, the present invention is directed to resonator-enhanced optoelectronic devices and methods of making same.

BACKGROUND

Researchers and engineers are continually striving to improve the performance, efficiency, quality, etc. of optoelectronic devices, such as light-emitting diodes (LEDs), laser diodes (LDs), and other light-emitting devices, as well as create lower cost light-emitting devices, and devices emitting in portions of the electromagnetic spectrum that currently lack high-quality, low-cost solutions, such as in the case with the so-called "green gap" that exists for green-light-emitting semiconductor-based LEDs and LDs.

Photoluminescent materials have been used as optical gain media for various light-emitting devices. However, the quantity of such materials used in many of these devices and the increased complexity of some of these devices make them more expensive than desired. In addition, conventional usage of phosphorescent materials has not solved problems that continue to exist, such as the green gap noted above.

SUMMARY OF THE DISCLOSURE

In one implementation, the present disclosure is directed to an optically pumped system. The system includes an optical resonator responsive to input light and including: a stack of multiple layers, wherein differing ones of the multiple layers are composed of differing materials, wherein: some of the differing layers are designed, configured, and arranged to define multiple reflectors; and the multiple reflectors are located to define multiple resonator cavities; and at least one photoluminescent layer located in at least one of the resonator cavities, wherein the at least one photoluminescent layer is designed to photoluminesce in the presence of the input light.

In another implementation, the present disclosure is directed to a method of forming an optical resonator system designed and configured to receive input light of a first wavelength and output output light of a second wavelength, wherein the first and second wavelengths differ from one another. The method includes arranging a plurality of reflectors to define a plurality of optical resonator cavities configured as a function of the input light and the output light; locating a photoluminescent layer between a pair of the plurality of reflectors, wherein the photoluminescent layer is selected to photoluminesce in the presence of the input light.

In still another implementation, the present disclosure is directed to an optically pumped system. The system includes a resonator responsive to input light and that includes: a phosphor comprising a quantum dot, the quantum dot having an outer surface and the phosphor selected to photoluminesce in the presence of the input light; and a reflector applied to the outer surface of the quantum dot so as to define an optical resonator cavity.

In yet another implementation, the present disclosure is directed to a method of making an optical resonator designed and configured to receive input light of a first wavelength and output output light of a second wavelength, wherein the first and second wavelengths differ from one another. The method includes providing a phosphor comprising a quantum dot selected to photoluminesce in the presence of the input light, the quantum dot having an outer surface; and applying a reflector to the outer surface of the quantum dot so as to form an optical resonator cavity.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 18 is a flow diagram of a method that can be used to create the multi-band resonator of FIG. 13;

DETAILED DESCRIPTION

Figure 1:
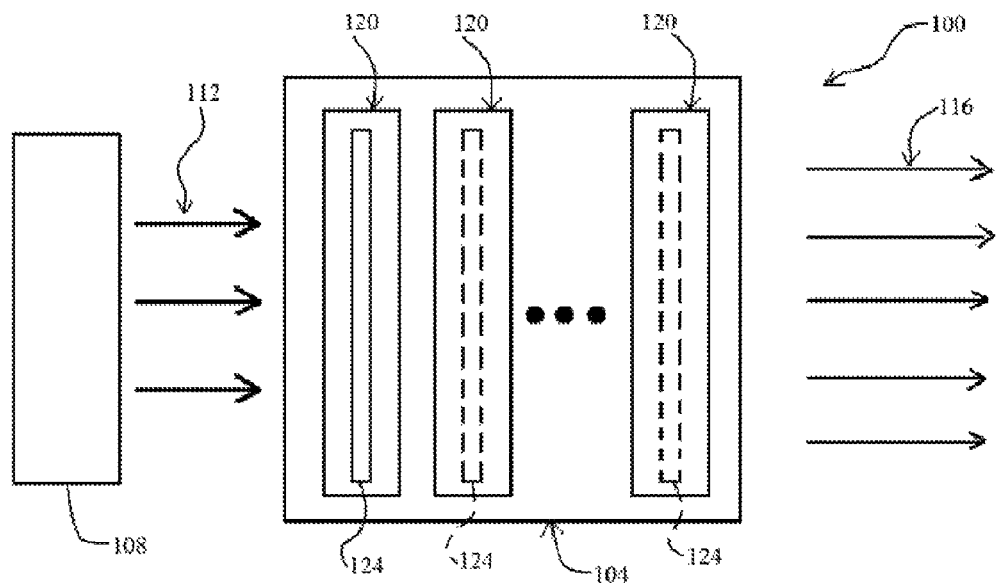
FIG. 1 is a high-level schematic diagram of a light-emitting system made in accordance with the present invention.

Referring now to FIG. 1, in one aspect the present invention is directed to a light-emitting system 100 that includes at least one optical resonator 104 (only one is shown for convenience; some of the examples below show multiple resonators) and at least one light source 108 that provides input light 112 to, or pumps, the optical resonator(s) and results in each optical resonator outputting output light 116. Unique features of optical resonator 104 include its having multiple optical resonator cavities 120 and at least one photoluminescent material 124. As will become evident from reading this entire disclosure, multiple optical resonator cavities 120 are typically located in series with one another, i.e., with each cavity being either adjacent to another cavity or between two cavities.

Photoluminescent material 124 can be composed of virtually any material that photoluminesces in the presence of input light 112 and that produces the desired effect. Photoluminescent material 124 can be located in any one or more of optical resonator cavities 120 in any of a variety of ways, depending upon the particular design at issue. For example, photoluminescent material 124 in any one of cavities 120 can be provided as a layer that defines or otherwise fills the entire cavity. In another example, photoluminescent material 124 can be provided so as to partially fill a single cavity 120, such as being provided in a single layer having a uniform thickness less than the cavity length, a single layer having varying thickness within the cavity, and as multiple layers within the cavity that are separated by one or more other materials. In addition, it is noted that more than one type of photoluminescent material 124 can be used within a single cavity 120 and/or among multiple cavities, depending on the particular design at issue.

As will be seen from the exemplary embodiments described below, unique optical resonator 104 can be implemented in a wide variety of ways to create new devices and systems and increase the efficiency of conventional devices and systems. As but one example, resonator 104 can be designed as a downconverter to create high-quality, high-brightness light-emitting diode (LED) or laser diode (LD) based green light without the shortcomings of current generation green emitting LEDs and LDs. Judicious design using techniques described herein can also be used to create devices and systems at costs lower than the costs of corresponding conventional devices and systems. For example, while it is known to use various photoluminescent materials (which can be expensive) in conventional semiconductor-based light-emitting devices, those materials are typically provided in relatively thick layers (e.g., on the order of 100 s of micrometers) outside of the optical resonator cavity. However, as disclosed herein, much thinner phosphor layers (e.g., on the order of 10 s of nanometers or less) can be used, if positioned inside one or more resonator cavities. These and other benefits of techniques and structures disclosed herein should become apparent from the exemplary embodiments described below.

Examples of photoluminescent materials that can be used for photoluminescent material 124 include: macro-, micro-, and nano-powders (quantum powder) of rare earth dopant activators; bulk semiconductor materials (macro-, micro-, nano-powders); quantum-confining structures such as: quantum wells, quantum wires, quantum dots, quantum nanotubes (hollow cylinder), quantum nanowires (solid cylinder), quantum nanobelts (solid rectangular cross section), quantum nanoshells, quantum nanofiber, quantum nanorods, quantum nanoribbons, quantum nanosheets, etc.; and metallic nanodots, like gold nanodots, silver nanodots, aluminum nanodots, etc., among others. The photoluminescent material can be embedded in host materials like: crystals, glasses, glass-like compositions, sol gel, semi solid-gel, semiconductors, insulator materials like: oxides, nitrides, oxy nitrides, sulfides etc. Alternatively, organic host materials may also be chosen. It is understood that the host material may be amorphous, nano crystalline, micro crystalline, poly crystalline, textured or single crystal in morphology. Photoluminescent material 124 may be made ex-situ and then bonded/deposited on top of the reflector coating of the optical cavity, alternatively, the photoluminescent material may be made/grown in-situ. Further examples of photoluminescent materials and techniques relating to each photoluminescent material 124 provided to optical resonator 104 can be found, e.g., at pages 11-14 of the above-identified U.S. Provisional Patent Application Ser. No. 61/631,135, filed on Dec. 29, 2011, and titled "New and Novel methods to increase the efficiency of Opto-electronic devices" ("the '135 application"), which is incorporated herein by reference for all of its teachings relating to photoluminescent materials and their usage in the context of the present disclosure. As will be seen in examples below, photoluminescent material 124 can be provided in any one or more of optical resonator cavities 120.

Each optical resonator cavity 120 may, for example, take the form of any of the following resonator architectures: plane parallel (also called "Fabry Perot"); concentric (spherical); confocal; hemispherical; concave-convex; Gires-Tournois interferometer, or any other suitable resonator architecture. Each optical resonator cavity 120 can be defined by two reflectors (not shown), which may be any suitable type of reflector. The reflectors may be balanced (same reflectivity) or un-balanced (different reflectivity). Both reflectors may be integrated or one may be in intimate contact with a phosphor structure (integrated), whereas the other reflector may not be in intimate contact with a phosphor structure within optical resonator 104. Optical resonator 104 may operate in the fundamental mode (smallest: $\lambda/2$ mirror spacing, wherein $\lambda$ is the particular design wavelength of resonance) or in any higher order mode (Non zero integer >1 multiple of $\lambda/2$ mirror spacing). When optical resonator cavities 120 are arranged in series, they may be coupled or non-coupled to each other. The coupling layer(s) (not shown) between resonator cavities 120 can be of the first order (lambda/4 condition) or a higher order (odd integer >1 multiple of lambda/4) solution.

Other techniques for creating each optical resonator 104 can be used. Examples include utilizing photonic crystals, photonic cavities, sub-wavelength gratings, and other specialized structures for high reflectivity. Also, those skilled in the art will readily appreciate that each optical resonator 104 may be created using microelectronic-mechanical systems, micro-optoelectronic-mechanical systems, nanoelectronic-mechanical systems, nano-optoelectronic-mechanical systems fabrication techniques.

Figure 3A:
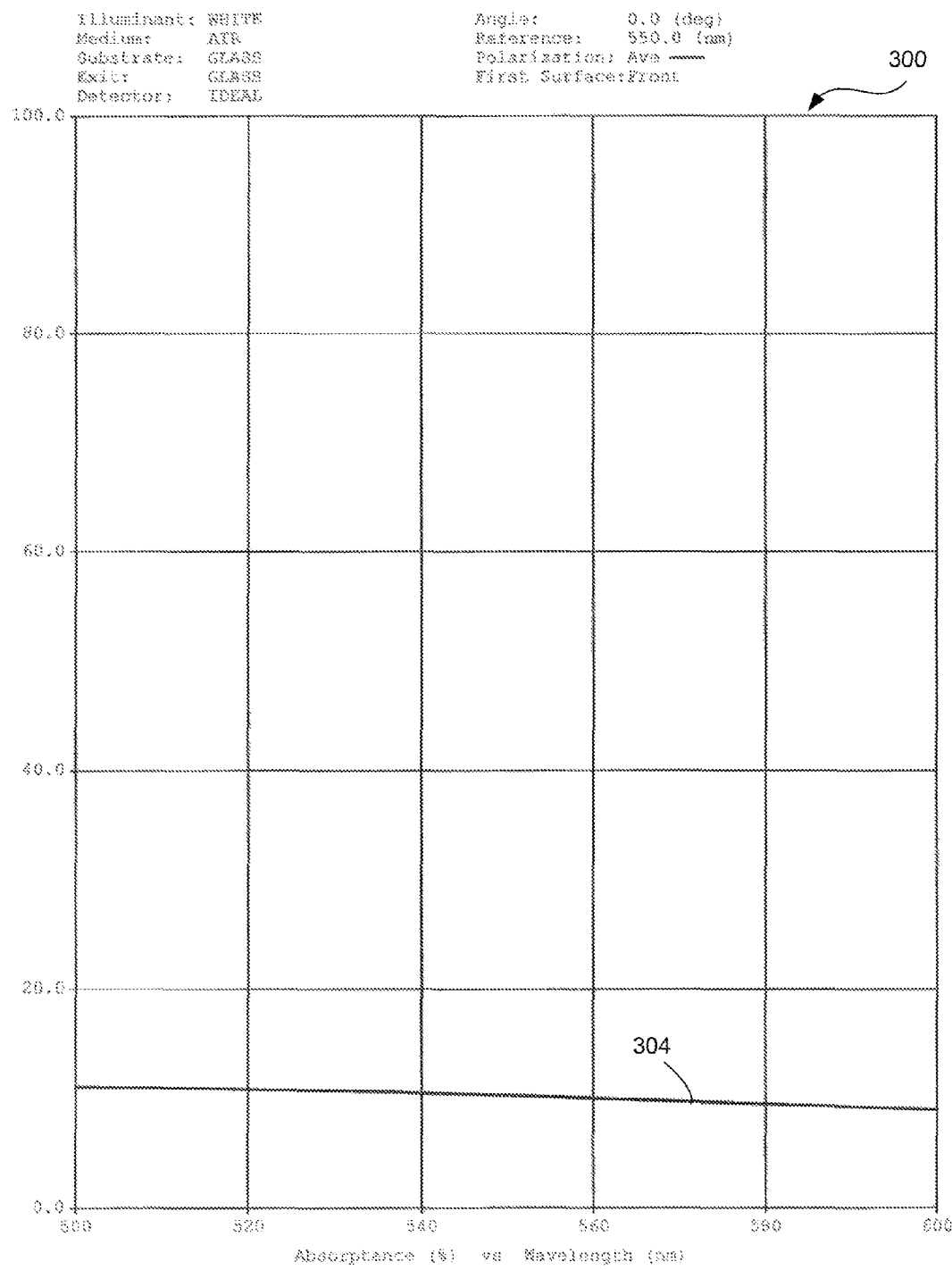
FIG. 3A is a graph of absorptance versus wavelength for an exemplary photoluminescent material having a physical thickness of about 114 nm and a refractive index of 2.42 and a k value of 0.04, both at 550 nm.
Figure 3B:
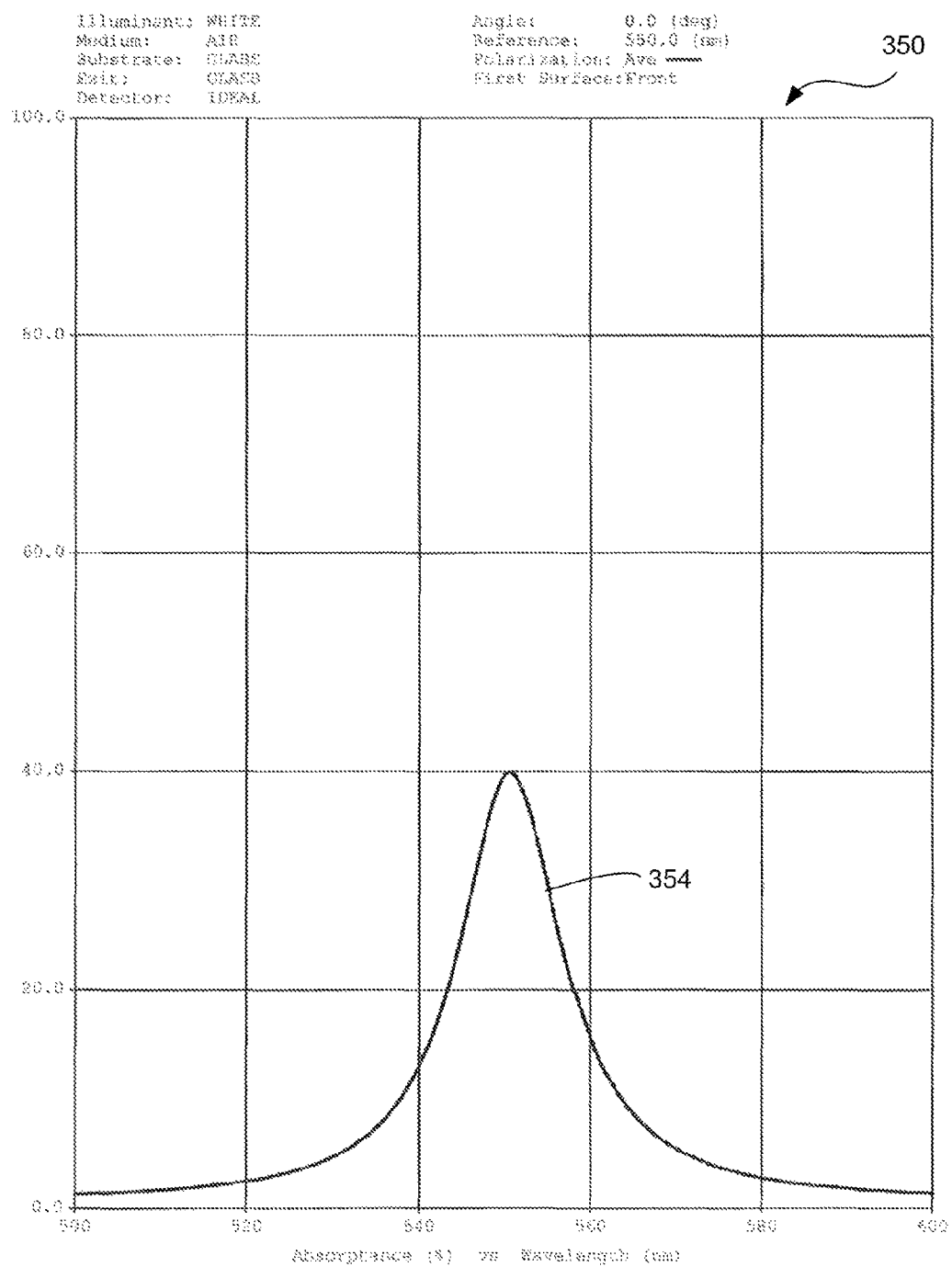
FIG. 3B is a graph of absorptance versus wavelength for the photoluminescent material of FIG. 3A when placed inside a suitably designed resonator cavity.

The electric field intensity of the on-resonance frequency (wavelength) can get very high (magnified) in high Q-factor optical resonator cavities. This magnified electric field intensity in turn results in very high (increased) absorption of the on-resonance wavelength when an absorber (absorbing at the on resonance wavelength) is placed inside the resonator cavity. FIGS. 3A and 3B illustrate the effect that an optical resonator cavity has on the absorption of light by a photoluminescent material. Referring first to graph 300 of FIG. 3A, this graph shows a plot 304 of the absorptance of light across a range of wavelengths for an exemplary photoluminescent material having a physical thickness of about 114 nm, a refractive index of 2.42 at 550 nm, and a k value of 0.04 at 550 nm. As seen from plot 304, the absorptance of light at 550 nm is about 10%. However, when that same material is placed in a suitably designed optical resonator cavity, as seen from plot 354 of FIG. 3B, the absorptance of light at 550 nm increases to about 40%.

When reflector layers are used to define an optical resonator cavity of the present invention, such as each of resonator cavities 120 of FIG. 1, those skilled in the art will understand that the peak/maxima of the electric field intensity can be positioned inside the resonator cavity or in any one of the reflector layers defining the cavity, depending on the actual design of the resonator cavity and the reflector stack. This in turn implies that the maximum electric field peak or any other sub-ordinate peak (side lobes) can be used to tailor the required absorption desired in photoluminescent material 124. The peak/maxima of the electric field intensity, if positioned inside the cavity may or may not be at the physical center of the optical cavity. Indeed, the electric field intensity maxima/minima can be spatially located anywhere in the optical cavity by judicious design. Further details of the design of optical resonator cavities 120 can be found throughout the '135 application, which is incorporated herein by reference for all of those teachings.

Input light 112 can be of any wavelength(s) suitable for the intended functioning of system 100. Exemplary wavelengths that can be contained in input light 112 include wavelengths in the infrared (e.g., near), visible, and ultraviolet (near and deep) classes of the electromagnetic spectrum. Correspondingly, each light source 108 can be a device that generates electromagnetic radiation at one or more wavelengths that fall within these classes and that are commensurate with the design of optical resonator(s) 104. Examples of such devices include, but are not limited to, light-emitting diodes, lasers (e.g., semiconductor, solid state, gas, photonic crystal, exiplex, chemical, etc.), lamps, etc. Some specific examples of devices that can be used for each light source 108 are provided below in exemplary embodiments. However, those skilled in the art will readily understand that the exemplary embodiments are provided for illustrative purposes and, therefore, should not be considered limiting relative to the scope of the inventions as defined in the appended claims.

Similarly, output light 116 can be of any wavelength(s) that optical resonator(s) 104 is/are capable of outputting based on input light 112. Examples of wavelengths that can be contained in output light 116 include wavelengths in the infrared (e.g., near), visible, and ultraviolet (near and deep) classes of the electromagnetic spectrum. As those skilled in the art will appreciate, the design of optical resonator(s) 104 can be tuned to output one or more desired wavelengths and/or to output light of a particular polarization. As will be seen below, such tuning can be achieved, for example, by properly selecting a suitable material for each phosphor 124 used, properly locating and arranging each phosphor structure (e.g., quantum-confining structure), and properly locating and arranging optical resonator cavities 120, among other things. Specific examples are provided below to illustrate design methodologies that can be used to create each optical resonator 104 and to illustrate particular useful applications of such optical resonators.

Figure 2:
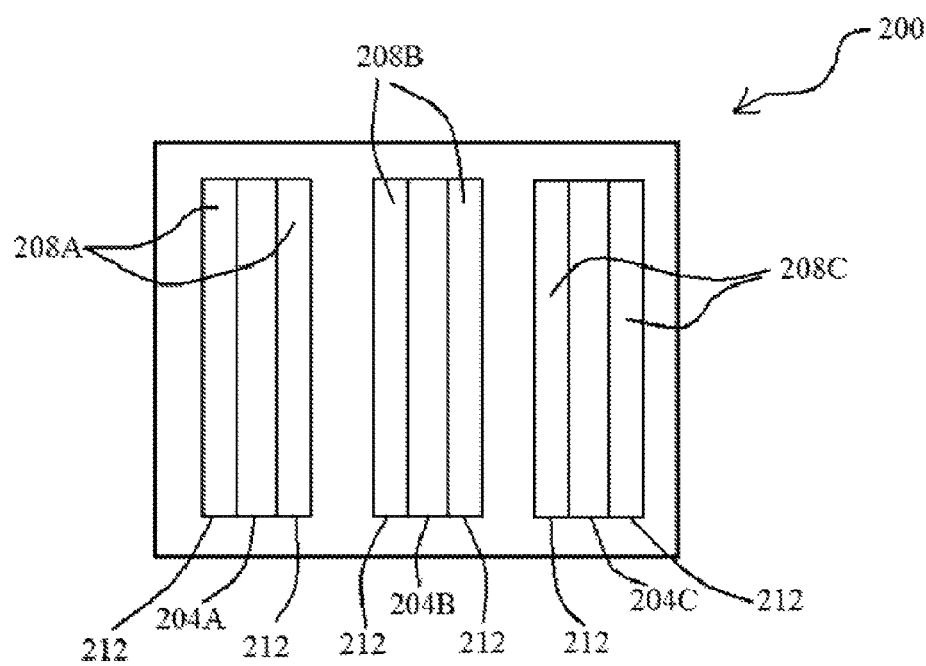
FIG. 2 is schematic diagram of a multi-cavity resonator having three optical resonator cavities arranged in series.

Turning to a first exemplary embodiment, FIG. 2 illustrates a multi-cavity resonator 200 that has three optical resonator cavities 204A, 204B, and 204C arranged in series with one another, and each resonator cavity is defined by a corresponding pair 208A, 208B, and 208C of spaced reflector stacks 212. Each reflector stack 212 can be composed of multiple layers of differing thickness. Each reflector stack 212 can be composed, for example, of multiple thin-film coating layers, multiple thick-film coating layers, or a combination of both thin- and thick-film coating layers. For the purposes of this disclosure and the appended claims, the term "thin film" and like terms shall mean a film having a physical thickness of less than 2 µm, and the term "thick film" and like terms shall mean a film having a thickness of 2 µm or more.

Figure 4A:
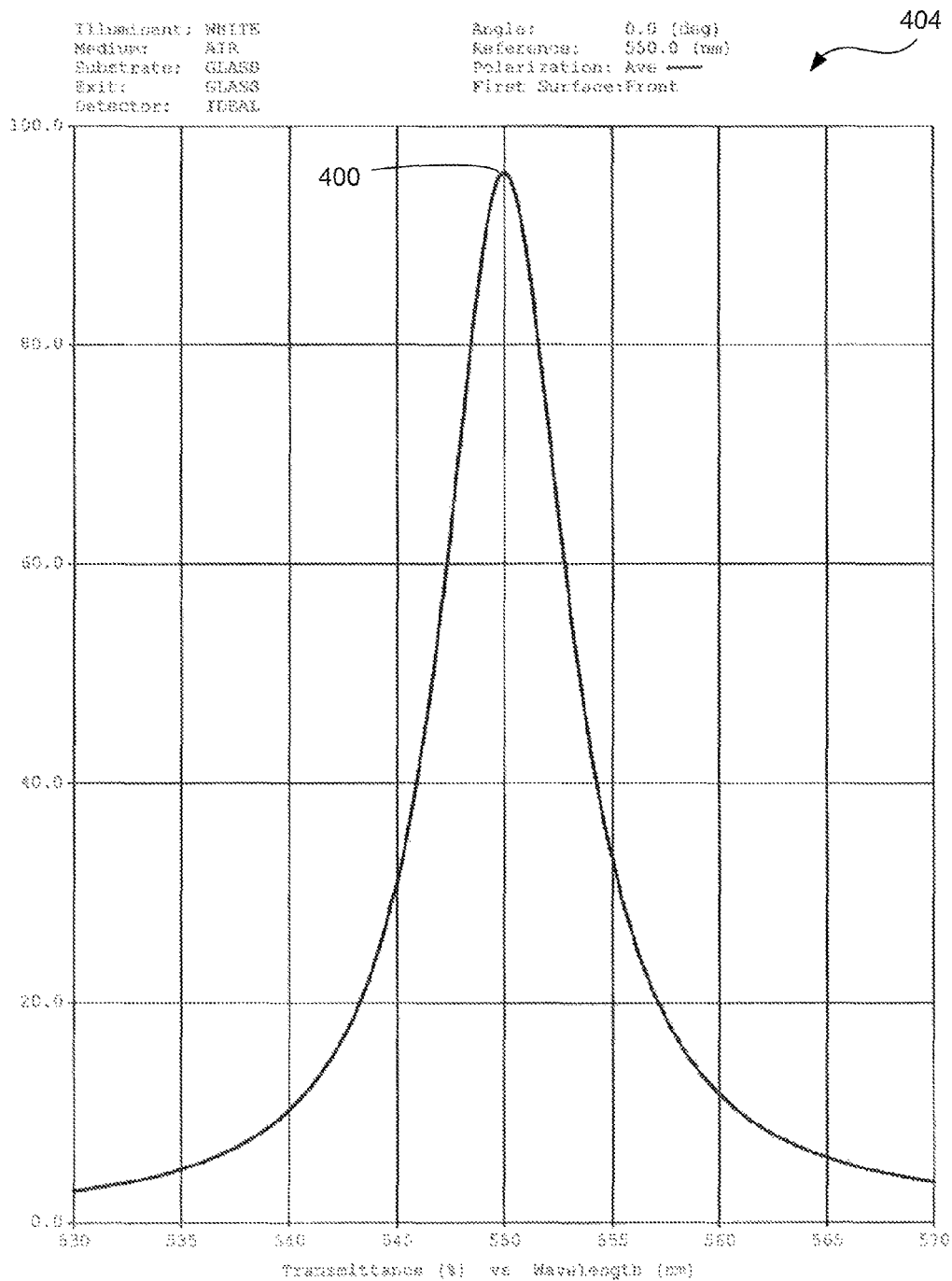
FIG. 4A is a graph of transmittance versus wavelength for a single cavity resonator having one optical resonator cavity.
Figure 4B:
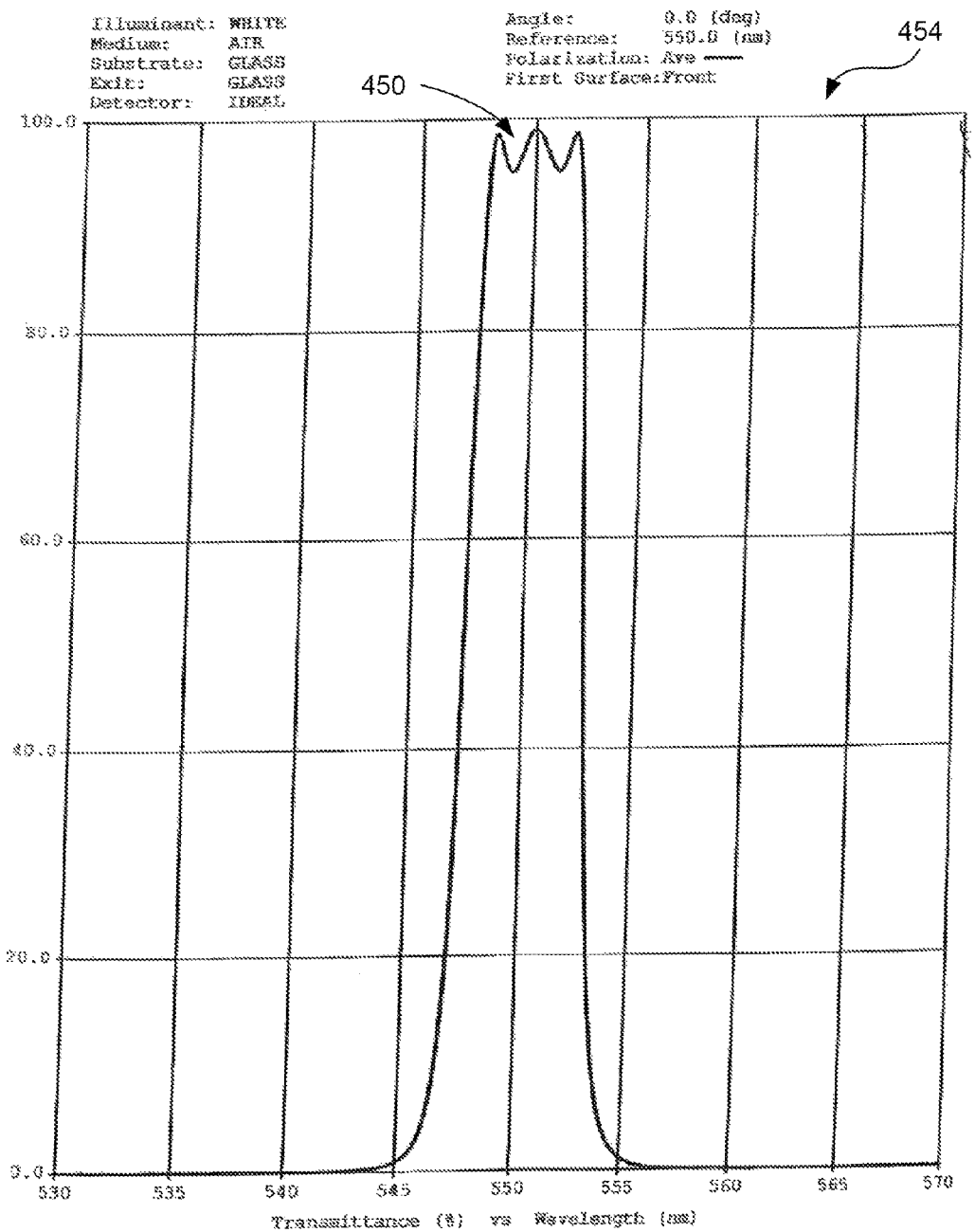
FIG. 4B is a graph of transmittance versus wavelength for a multi-cavity resonator having three optical resonator cavities.

Generally and as mentioned above, resonator cavities 204A, 204B, and 204C can be coupled or non-coupled, as desired. One motivation for using a multi-cavity resonator, such as resonator 200 of FIG. 2, over a single-cavity resonator is that the multiple cavities can be used to change the spectral profile of the resonator from a narrow-peak profile (see, e.g., peak 400 in graph 404 of FIG. 4A) to a squarer-peaked profile (see, e.g., peak 450 in graph 454 of FIG. 4B). This can be useful, for example, to mitigate effects of temperature, which cause changes in optical resonator cavity lengths, or the absorption of on-resonance wavelengths. It is noted that graph 404 of FIG. 4A is a graph of spectral output of an optical resonator having a single resonator cavity as generated by TFCALC™ thin film design software available from Software Spectra, Inc., Portland, Oreg. Graph 454 of FIG. 4B is similarly a graph of spectral output of an optical resonator having three coupled resonator cavities arranged in series with one another in a manner similar to multi-cavity resonator 200 of FIG. 2. Another motivation for using a multi-cavity resonator is to create a light-emitting system that outputs light of specific differing wavelengths, for example, to create a light output that is a mixture of individual colors corresponding to individual resonator cavities within the multi-cavity resonator.

Figure 5:
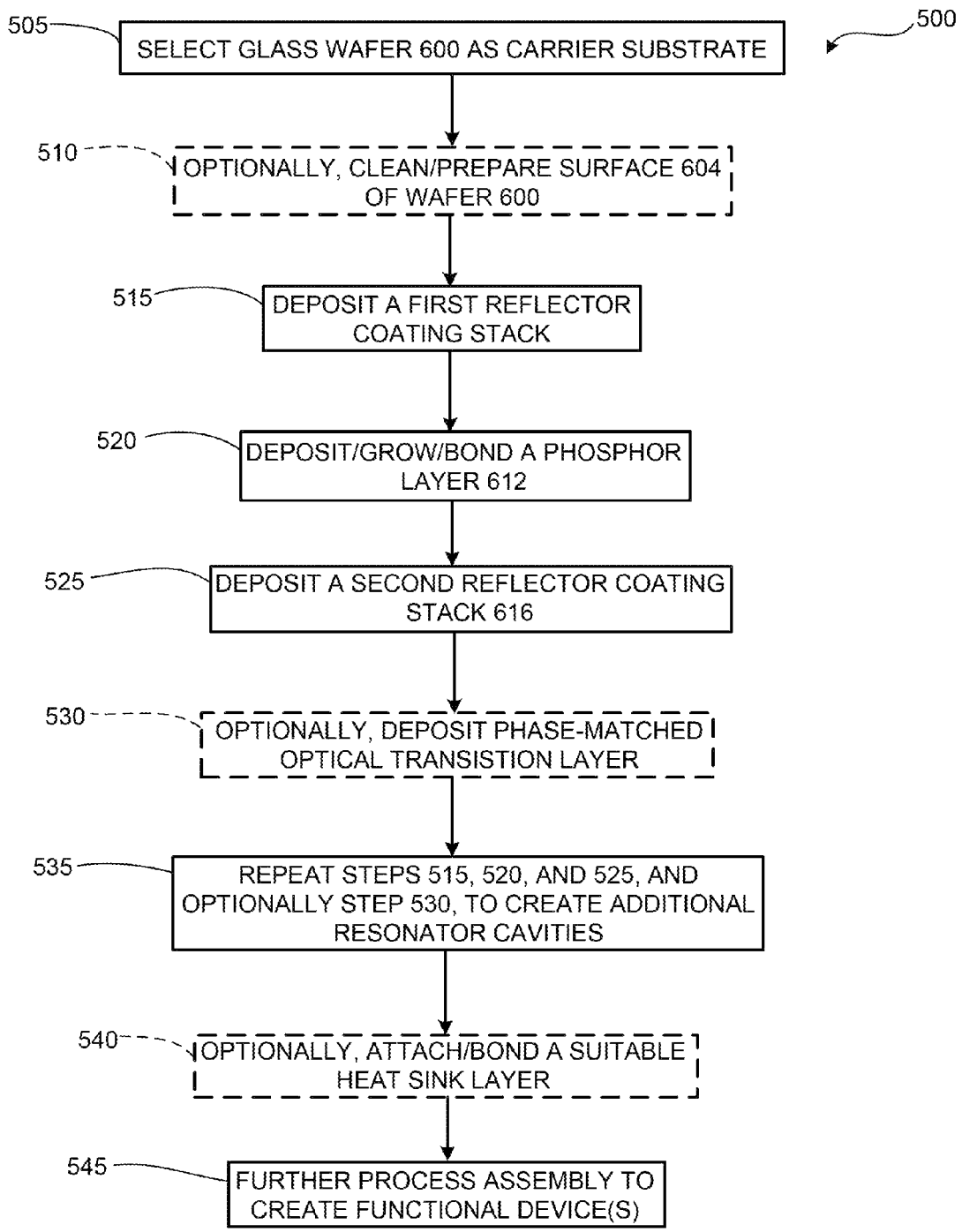
FIG. 5 is a flow diagram of a method that can be used to create the multi-cavity resonator of FIG. 2.

FIG. 5 and Table I, below, illustrate a method 500 that can be used to fabricate multi-cavity resonator 200 of FIG. 2. A number of the steps of method 500 are illustrated in corresponding respective ones of FIGS. 6A to 6D.

TABLE I

Method 500 of FIG. 5

| Step | FIG. | Description |
|---|---|---|
| 505 | 6A | Select a glass wafer 600 as the starting carrier substrate. |
| 510 |  | Optionally, in-situ clean and prepare the surface 604 of glass wafer 600 for coating deposition of subsequent step. |
| 515 | 6B | Deposit a first reflector coating stack 608 on surface 604 of glass wafer 600. First reflector coating stack 608 is designed such that, upon device completion the corresponding resonator cavity 204A (FIG. 2) constructively resonates for the input/pump wavelength. |
| 520 | 6C | Deposit/grow/bond the desired phosphor layer 612 on reflector coating stack 608. The thickness of phosphor layer 612 will be pre-determined by design based on the properties of the phosphor layer (e.g., material, composition, absorption coefficients for the input/pump wavelength, etc), phosphor layer 612 serves as a photoluminescent layer within resonator cavity 204A (FIG. 2). |
| 525 | 6D | Deposit a second reflector coating stack 616 on phosphor layer 612. Second reflector coating stack 616 is designed such that, upon device completion, resonator cavity 204A (FIG. 2) constructively resonates for the input/pump wavelength. This completes the construction of the first optical resonator cavity 204A (FIG. 2). |
| 530 |  | Optionally, deposit a phased-matched optical transition layer (not shown) on second reflector coating stack 616. |
| 535 |  | Repeat steps 515, 520, and 525, and optionally step 530, to create resonator cavities 204B and 204C (FIG. 2) in the same manner as resonator cavity 204A was created by initial performing of steps 515, 520, and 525. |
| 540 |  | Optionally, attach/bond a suitable heat sink layer (not shown) on the last created reflector coating stack from step 535. |
| 545 |  | Further process the assembly as desired to create functional devices, etc. For example, add pump-light source (see, e.g., light source(s) 108 of FIG. 1), perform QC measurements, package, ship, etc. |

As those skilled in the art will readily appreciate, numerous changes can be made to method 500 to create multi-cavity resonators similar to resonator 200 of FIG. 2. For example, in addition to performing or not performing the various optional steps noted above: one or more of the multiple cavities do not necessarily need to include the phosphor layer created at step 520 of FIG. 5 and Table I, above; the starting substrate need not be glass, but rather can be any other suitable material having transmissibility at the necessary wavelength(s)/spectral bands; and steps 515, 520, 525, and optionally 530 can be repeated as many times as needed to create the desired number of optical resonator cavities. In addition, depending on the material of the starting substrate (glass wafer 600 (FIG. 6A) was used in this example), it can be removed as needed, for example, if a permanent substrate is attached to outer reflector stack created last or to the heat-sink layer formed on that reflector stack. Those skilled in the art will understand how to perform the various steps of method 500 of FIG. 5 and Table I, including forming reflector coating stacks 608, 616, since the techniques used to perform these steps are well-known in the art. In addition, for further information on technique and other information relating to method 500 reference can be made to the '135 application, which is incorporated herein by reference for all of its teachings of such techniques and information. The light sources (not shown, but see light source(s) 108 of FIG. 1) added at step 545 can be any suitable light source emitting light at the desired pump/input wavelength(s), such as one or more LEDs or LDs, among others.

Figure 6A:
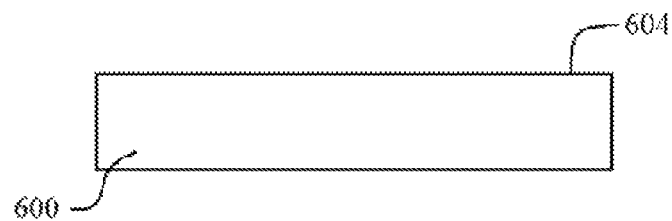
FIGS. 6A to 6D are diagrams illustrating various steps of the method of FIG. 5.
Figure 6B:
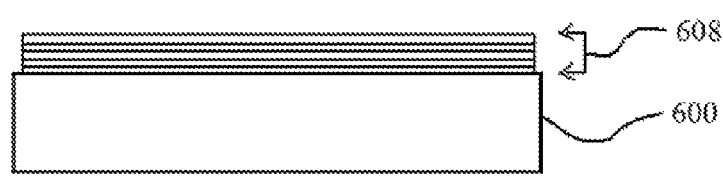
Figure 6C:
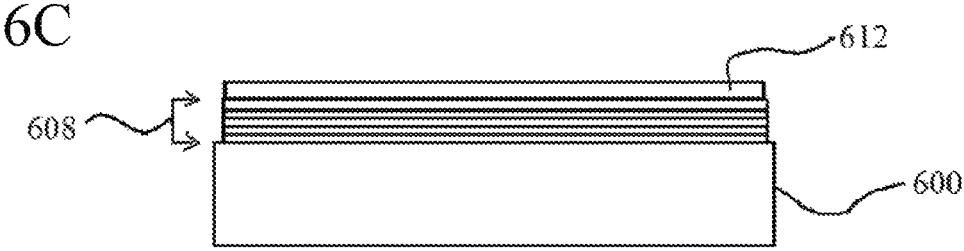

Referring to FIG. 2, in this example, the space between each reflector pair 208A, 208B, and 208C, which defines the length of the corresponding optical resonator cavity 204A, 204B, and 204C, contains a phosphor layer, such as phosphor layer 612 of FIG. 6C. Each phosphor layer can include a phosphor forming a low index spacer, a high index spacer, or a medium index spacer. Each phosphor layer 612 can occupy the entire length of the corresponding optical cavity or, alternatively, can occupy only a portion of the optical cavity's length, as desired/needed to suit a particular design. In a case of phosphor layer 612 occupying only a portion of the optical cavity length, the layer can be located as desired/needed within the cavity, and not necessarily at the midpoint of the cavity's length.

Figure 7:
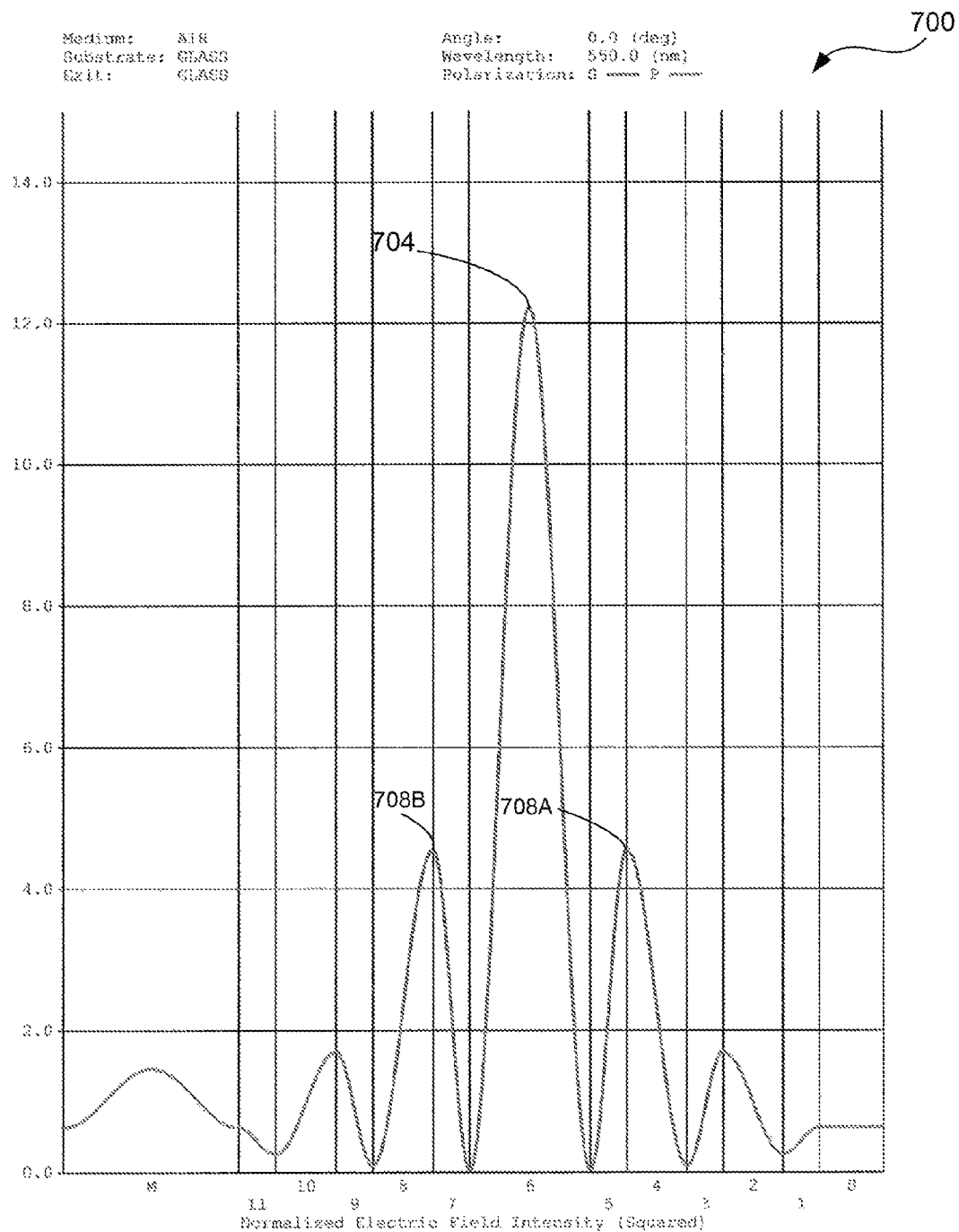
FIG. 7 is a graph of electric field intensity squared versus location for a single-cavity optical resonator having a cavity containing a low-index material.

FIG. 7 is a graph 700 of electric field intensity squared versus location within a single-cavity resonator (not shown, but which could essentially be the single cavity shown in FIG. 6C). This resonator is composed of eleven layers (labeled "1" through "11" along the x-axis of the graph) applied to a glass substrate (labeled "S") and exposed to air (labeled "M"). As those skilled in the art will readily appreciate, layers 1 to 5 are alternating layers of high- and low-index materials forming a first reflector, and layers 7 to 11 are similarly alternating layers of high- and low-index materials forming a second reflector. Layers 5 and 7 in this example are composed of high-index materials. Layer 6 is the layer in the resonator cavity and is composed of a low-index material. As seen, the peak 704 of the field intensity is located at the center of layer 6 (the cavity), with primary side lobes 708A and 708B peaking at the interfaces of first reflector layers 4 and 5 and second reflector layers 7 and 8, respectively. While the resonator design corresponding to graph 700 of FIG. 7, does not include a photoluminescent material, it illustrates where one might desire to locate the photoluminescent material, i.e., in layer 6 where peak 704 falls.

Figure 8:
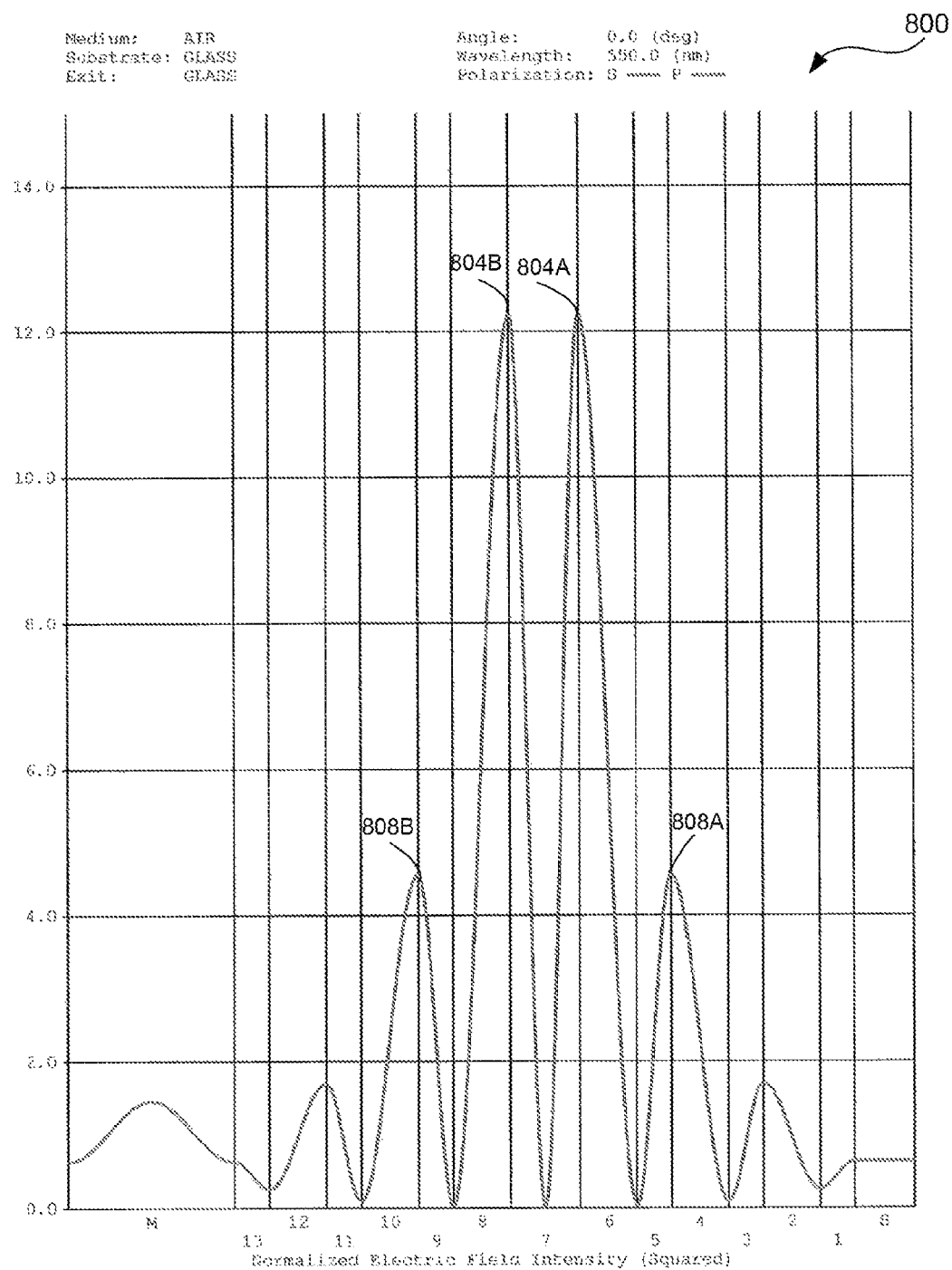
FIG. 8 is a graph of electric field intensity squared versus location for a single-cavity optical resonator having a cavity containing a high-index material.

FIG. 8 is a graph 800 of electric field intensity squared versus location within a single-cavity resonator (not shown, but which could essentially be the single cavity shown in FIG. 6C). This resonator is composed of thirteen layers (labeled "1" through "13" along the x-axis of the graph) applied to a glass substrate (labeled "S") and exposed to air (labeled "M"). As those skilled in the art will readily appreciate, layers 1 to 6 are alternating layers of high- and low-index materials forming a first reflector, and layers 8 to 13 are similarly alternating layers of high- and low-index materials forming a second reflector. Layers 6 and 8 in this example are composed of low-index materials. Layer 7 is the layer in the resonator cavity and is composed of a high-index material. As seen, with this configuration, the field intensity has two peaks 804A and 804B located, respectively, at the interfaces between cavity layer 7 with first reflector layer 6 and between cavity layer 7 with second reflector layer 8. The primary side lobes 808A and 808B peak at the same locations as in graph 700 of FIG. 7, i.e., at the interfaces of first reflector layers 4 and 5 and second reflector layers 7 and 8, respectively. Like the resonator design corresponding to FIG. 7, the resonator design corresponding to graph 800 of FIG. 8 does not include any photoluminescent material. A purpose of presenting graph 800 is to show that differing resonator designs can produce differing electrical field intensity profiles. It should be apparent from comparing graphs 700 and 800 of FIGS. 7 and 8, respectively, that a designer can tune the electrical field intensity profile of a resonator cavity as desired/needed to suit a particular application. In the resonator corresponding to FIG. 8, a judicious choice for locating photoluminescent material would be at the interface of layers 6 and 7 and the interface of layers 7 and 8, i.e., near corresponding respective peaks 804A and 804B.

Figure 9:
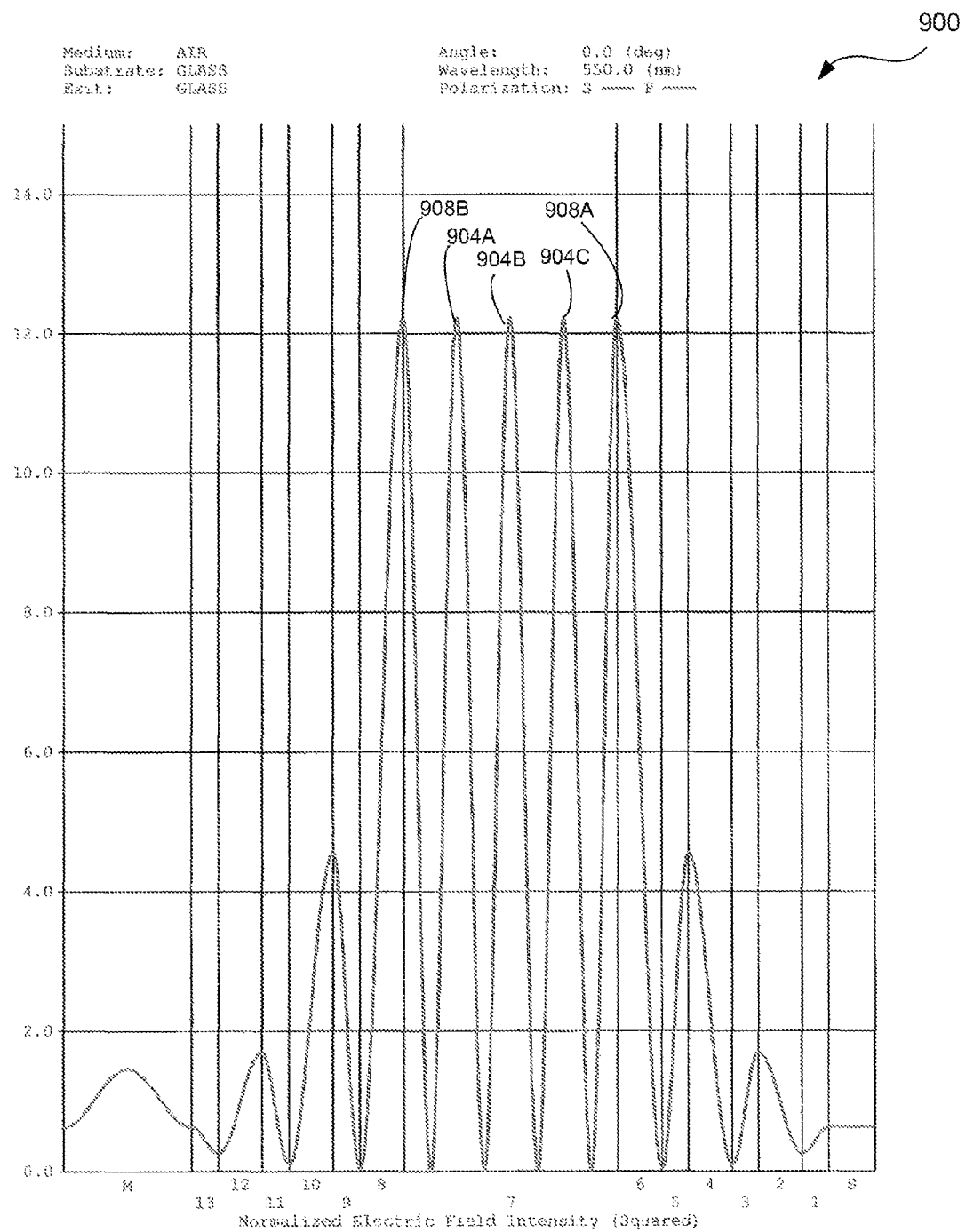
FIG. 9 is a graph of electric field intensity squared versus location for a single-cavity optical resonator having a cavity length of twice the design wavelength.

In addition to changing the index(ices) of refraction of the material(s) within each optical resonator cavity, the length of the cavity can be changed to suit a particular design. For example, the cavity length can be any non-zero integer multiple of one-half the design or resonance wavelength, or $\lambda/2$. FIG. 9 illustrates an example in which the cavity length, i.e., the thickness of layer 7 in graph 900 of FIG. 9, is four times $\lambda/2$, or twice the design or resonance wavelength. As seen in graph 900, this arrangement results in the field intensity having three peaks 904A, 904B, and 904C within the optical cavity (i.e., layer 7) and two peaks 908A and 908B at the corresponding interfaces of the optical cavity with reflector layers 6 and 8. While the resonator depicted in FIG. 9 does not contain any photoluminescent material, those skilled in the art will appreciate the benefit of adding one or more photoluminescent layers so that each is coincident with, or at least immediately adjacent to, one or more of peaks 904A, 904B, 904C, 908A, and 908B, to take advantage of high electrical fields at those locations. In one example, a very thin layer of photoluminescent material, e.g., a quantum layer, can be located at each of peaks 904A, 904B, and 904C within the optical cavity, here, layer 7. Of course, other layering and arrangements are possible, and those skilled in the art will understand such alternatives.

As should be evident from the foregoing descriptions of FIGS. 7 to 9, the insertion of one or more photoluminescent layers inside the optical cavity of a resonator results in a reduction in phosphor layer thickness (and cost) as well as allows for the tailoring/optimizing of absorption in the phosphor and hence the tuning of the output profile of phosphors.

Figure 10:
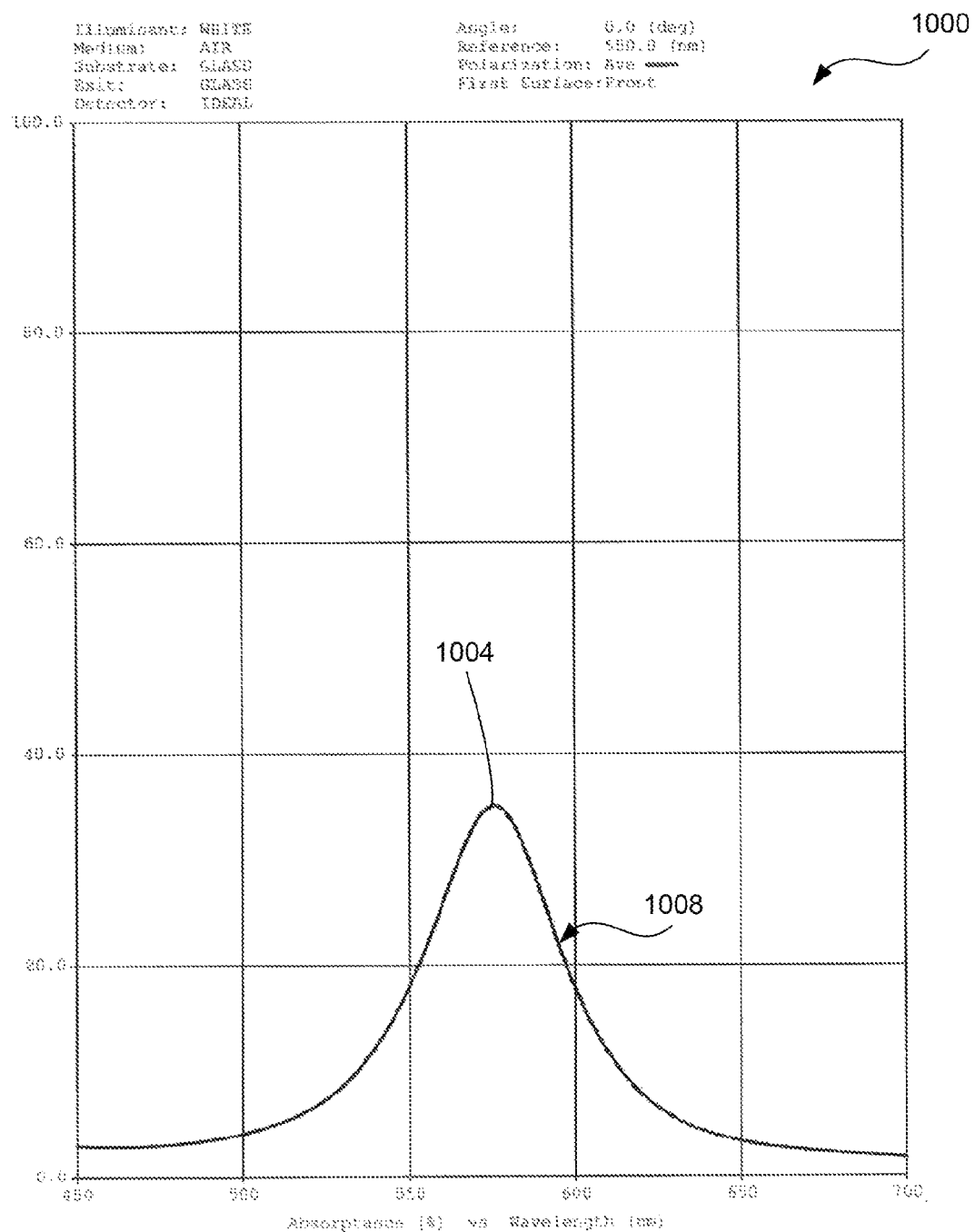
FIG. 10 is a graph of absorptance versus wavelength for a single-cavity optical resonator, wherein the photoluminescent phosphor is positioned at the maximum electric field location in the resonator.
Figure 11:
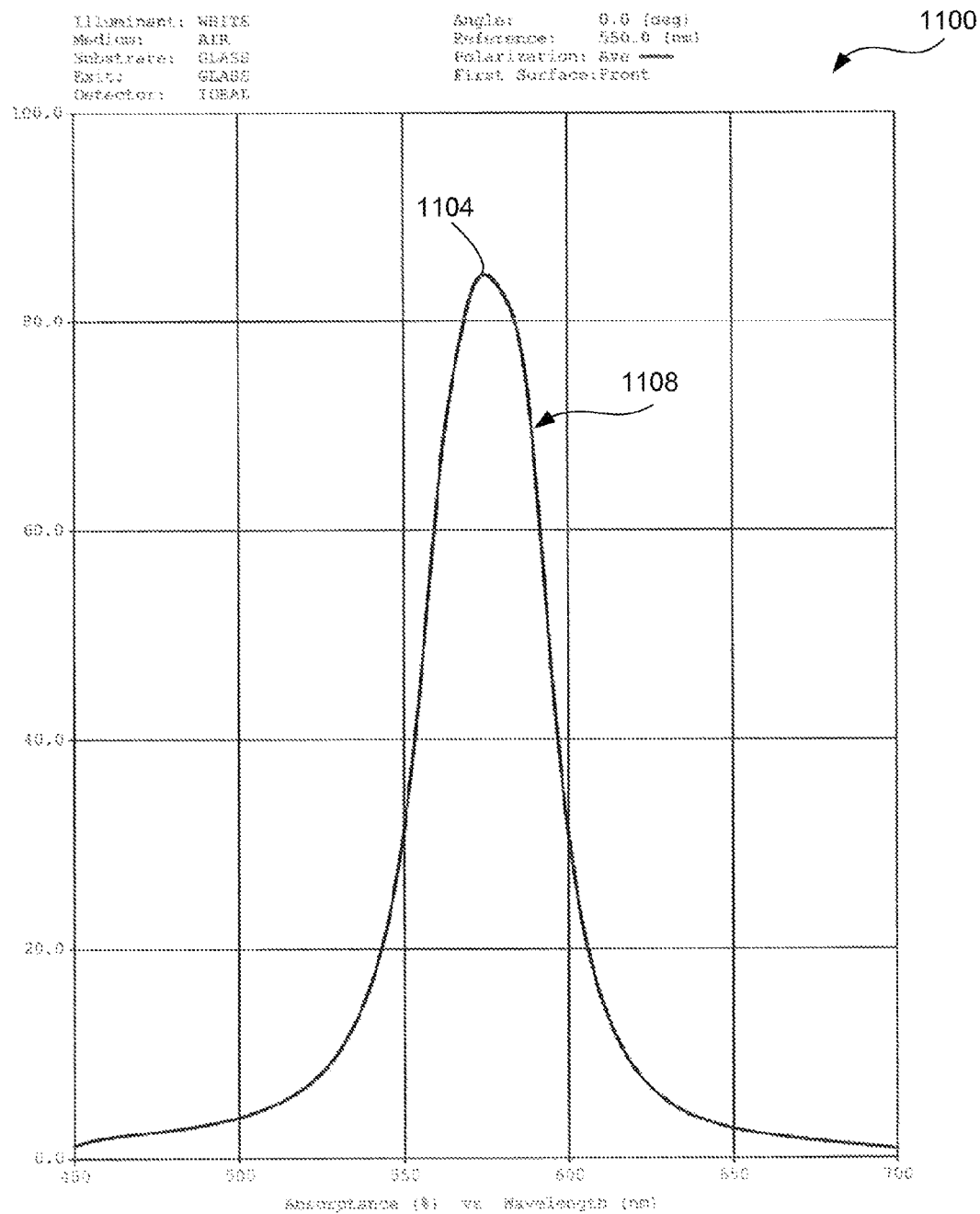
FIG. 11 is a graph of absorptance versus wavelength for a multi-cavity optical resonator, wherein the photoluminescent phosphor is positioned at the maximum electric field location in one or more of the cavities.

While single-cavity optical resonators can benefit from locating one or more photoluminescent materials/layers within the resonator cavity, novel multi-cavity resonators disclosed herein can achieve even more desirable results. For example, FIGS. 10 and 11 depict an example of the difference in absorptance between a single-cavity optical resonator in which the cavity contains a photoluminescent phosphor (FIG. 10) and a multi-cavity optical resonator containing multiple cavities with multiple photoluminescent phosphor layers (FIG. 11). As seen in the absorptance versus wavelength graph 1000 of FIG. 10, for a single-cavity resonator, the peak 1004 of the absorptance curve 1008 is at about 35% absorptance. However, in the absorptance versus wavelength graph 1100 of FIG. 11 for a four-cavity resonator, the peak 1104 of the absorptance curve 1108 is at about 84% absorptance. As is evident from comparing the absorptance curves 1008 and 1108 of FIGS. 10 and 11, respectively, the multi-cavity optical resonator allows for a significantly broader absorptance region, and the magnitude of absorptance is also higher. When the phosphors are used as down converters using pump sources (LEDs, LDs, etc.), a multi-cavity resonator would ideally be designed to have maximum absorptance at the pump wavelengths and also have maximum transmission at the downconverted/output wavelength(s).

It is noted that the placement of a phosphor layer in an optical resonator is known, and in that context the phosphor layer is called an "optical gain media" or the overall arrangement is called an "optical amplifier arrangement," among other things. However, to the best of the inventor's knowledge, photoluminescent phosphors have never been used in such an arrangement for a variety of reasons. For example, if an LED light source is used to pump a conventional phosphor-containing optical arrangement, the single-cavity resonator will only support a very narrow range of wavelengths that will be on resonance for the LEDs input light source. Therefore, a significant spectrum of the LED input simply does not get into the single-cavity resonator to get absorbed in the phosphor layer, which would lead to high efficiency loss outright. This situation is further exacerbated as the Q-factor of the resonator gets higher. A higher Q-factor leads to reduction/narrowing of the bandwidth (band pass) of the resonator. In a similar fashion, if an LD is used to "pump" a conventional single-cavity phosphor-containing resonator, the LD would need to be wavelength stabilized (additional expense with heat sinks and sensors). Otherwise small shifts in the LD wavelength would result in significant shifts in the absorption in the phosphor layer, resulting in widely fluctuating output wavelength and amplitude.

Figure 12:
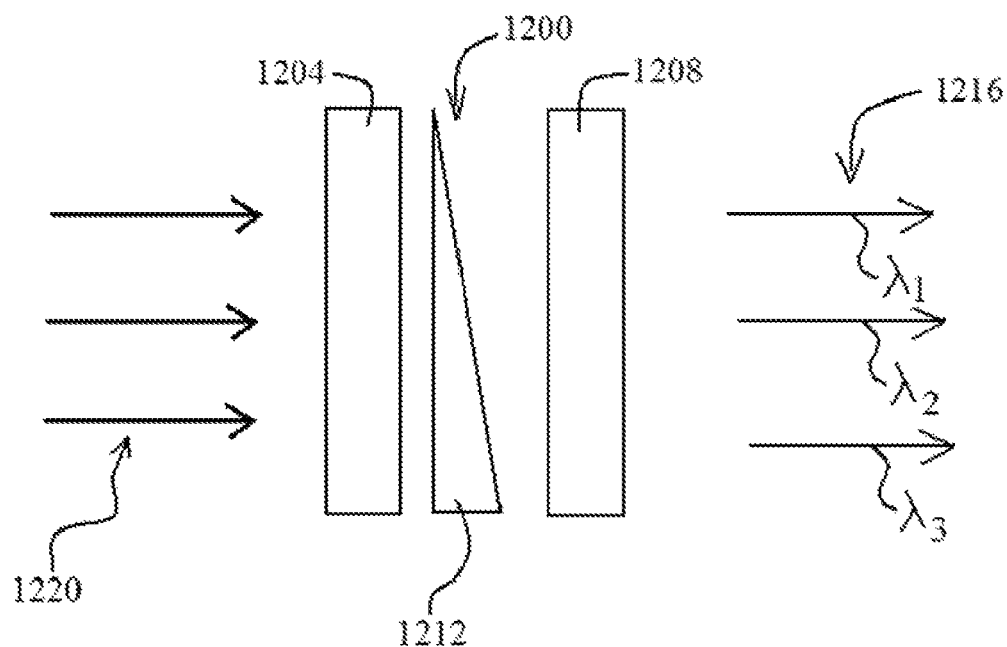
FIG. 12 is a diagram of an optical resonator cavity that contains a phosphor layer having a non-uniform thickness.

The foregoing examples illustrate the phosphor-containing layers as being uniformly thick. However, in other embodiments, each, some, or all of the one or more of the phosphor-containing layers in each optical resonator can have a non-uniform thickness. An example of this is illustrated in FIG. 12, which shows a single optical resonator cavity 1200 defined by first and second reflectors 1204 and 1208 and that contains a photoluminescent phosphor layer 1212 having a non-uniform thickness, here, a thickness having a constant rate of change, resulting in the layer having a wedge shape. The regions of differing thickness within phosphor layer 1212 can result in the output light 1216 having multiple wavelengths, here $\lambda_1$, $\lambda_2$, and $\lambda_3$, corresponding to the differing regions in the presence of uniform input light 1220. It is noted that the thickness of photoluminescent phosphor layer 1212 need not have a monotonic slope as depicted in FIG. 12. Indeed, other geometries are possible, such as stepped and geometries having various curvatures. In addition, for multi-cavity optical resonators the geometries can be the same as among multiple ones of the optical cavities, or they can differ among the multiple cavities.

Various techniques exist for creating non-uniform-thickness phosphor layers. For example, a phosphor layer of substantially uniform thickness may be preferentially etched/ablated to create the layer thickness variation desired. Direct etching may be done by ion beam etching, chemical etching, laser assisted etching, photo-ablation, directed plasma etching, etc., techniques such as gray scale lithography and micro/nano imprinting may be used to create the desired patterns in a photoresist. The pattern can then be subsequently transferred into phosphor layer using isotropic or anisotropic etching mechanisms to create the layer thickness variation desired.

Each photoluminescent phosphor layer, such as layer 612 of FIG. 6C, of an optical resonator made in accordance with the present disclosure can be composed of a single phosphor material or can be composed of multiple phosphor materials. For example, multiple activator species materials could be embedded in the same host or multiple hosts and then inserted into an optical resonator cavity. Quantum dots of varying sizes and compositions could be mixed together or stacked on top of each other and then inserted into an optical resonator cavity. Similarly, quantum wells and other quantum-confining structures of varying sizes and compositions may be mixed together or stacked on top of each other and then inserted into an optical resonator cavity. Multi-layer semiconductor films of varying thicknesses and compositions may be mixed together or stacked on top of each other and then inserted into an optical resonator cavity.

Many different semiconductor materials in thin-film form can be used as photoluminescent phosphor layers in devices made in accordance with the present disclosure. These coating layers need not be quantum confining. These semiconductor thin films may be composed of any of the materials as outlined, for example, on pages 41-43 of the '135 application, which is incorporated herein by reference for all of the exemplary materials for and arrangements of phosphor layers in optical resonators made in accordance with the present invention. These films can be single crystal, polycrystalline, preferentially oriented, textured, micro or nano crystalline or amorphous in morphology. Materials of particular interest for use in photoluminescent phosphor layers may be the wide band gap II-VI materials. Since II-VI semiconductors have direct energy gaps and large effective masses, they are very efficient in light absorption and emission. The II-VI materials may be composed of binary, ternary, or quarternary combinations such as: ZnS, ZnSe, ZnSSe, ZnTe, ZnSTe, ZnSeTe, CdS, CdSe, CdTe, CdSSe, CdSTe, CdSeTe, HgS, HgSe, HgTe, among others.

Figure 6D:
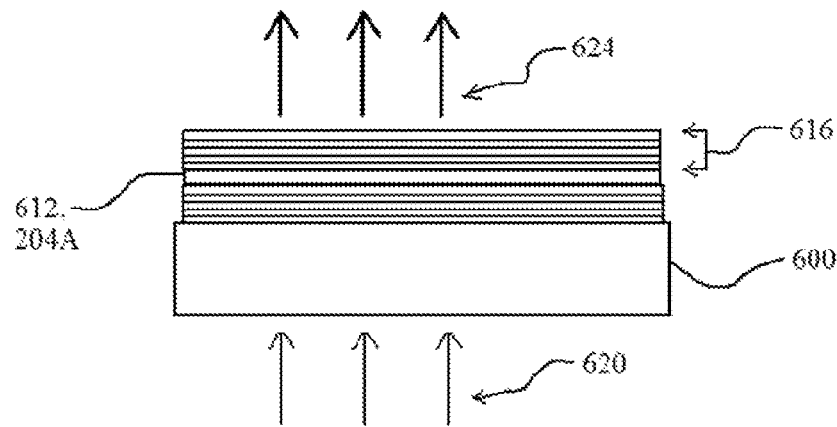

In the foregoing embodiments, the cavity-defining reflectors are optimized for high reflectivity for the on-resonance input/pump wavelength. However, it would be advantageous to design the reflectors so that not only are they optimized for high reflectivity for the on-resonance input/pump wavelength but they also have high reflectivity to reflect and preferentially redirect the output light from the photoluminescent phosphor layer(s). For example, in the context of the single cavity 204A depicted in FIG. 6D with input light 620 entering as shown in FIG. 6D, first reflector stack 608 is made highly reflective to the output light 624, while second reflector stack 616 is made as transmissive as possible for the output light 624. This type of resonator architecture is orientation specific. It is imperative in this design that input light 620 come in from the bottom as depicted in FIG. 6D. If input light 620 were to be inserted from the top, output light 624 would simply be reflected back in input light direction. Another reflector could be added to the assemblage to separate and re-direct the output light. However, this would just add to the complexity of the optical layout.

Figure 13:
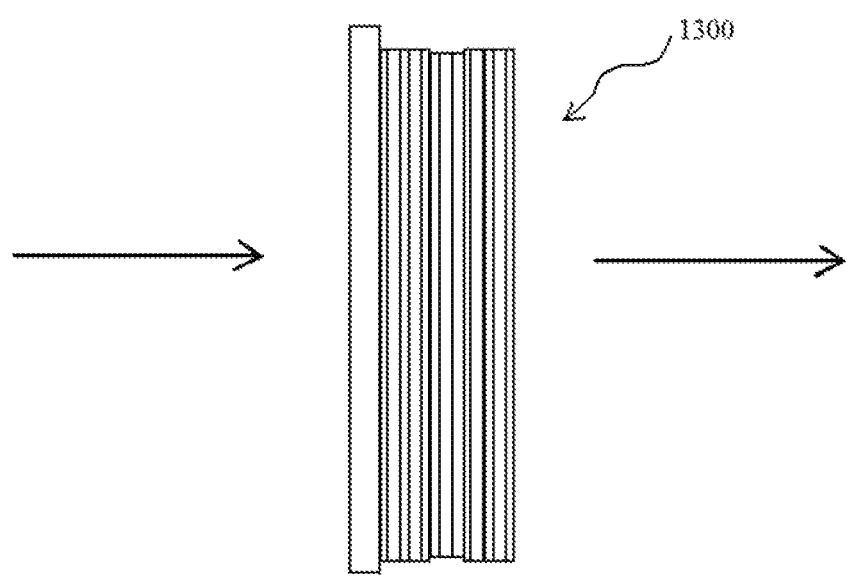
FIG. 13 is a diagram of a multiband resonator designed and configured to simultaneously resonate at wavelengths of the input light and the output light.

The exemplary embodiments described above involve optical resonators optimized for on-resonance absorption of the input light wavelength(s). However, multi-cavity designs can be implemented that are also optimized for resonating at the wavelength(s) of the output light simultaneously with the input wavelength(s). Such novel resonators can be referred to as "multiband resonators." FIG. 13 illustrates an exemplary multiband resonator 1300 composed of fifteen layers of various materials and thicknesses. The present inventor modeled multiband resonator using the TFCALC™ software mentioned above using the input parameters of Table II and the coating design of Table III, below.

TABLE II

| PARAMETERS FOR TFCALC ™ SOFTWARE | |
| --- | --- |
| Input light wavelength | ~420 nm |
| Output light wavelength | ~630 nm |
| Refractive index of high-index (H) material | 2.422 @ 500 nm |
| Refractive index of low-index (L) material | 1.459 @ 500 nm |
| Refractive index of medium-index (M) material | 1.38 @ 550 nm |
| Coating substrate | Glass |
| Incident medium | Air |
| Exit medium | Glass |

TABLE III

| COATING DESIGN FOR TFCALC ™ SOFTWARE | | |
| --- | --- | --- |
| Layer | Refractive Index | Thickness (nm) |
| 1 | H | 51.61 |
| 2 | L | 85.68 |
| 3 | H | 103.22 |
| 4 | L | 171.35 |
| 5 | H | 103.22 |
| 6 | L | 85.68 |
| 7 | H | 51.61 |
| 8 | M | 90.58 |
| 9 | H | 51.61 |
| 10 | L | 85.68 |
| 11 | H | 103.22 |
| 12 | L | 171.35 |
| 13 | H | 103.22 |
| 14 | L | 85.68 |
| 15 | H | 51.61 |

Figure 15:
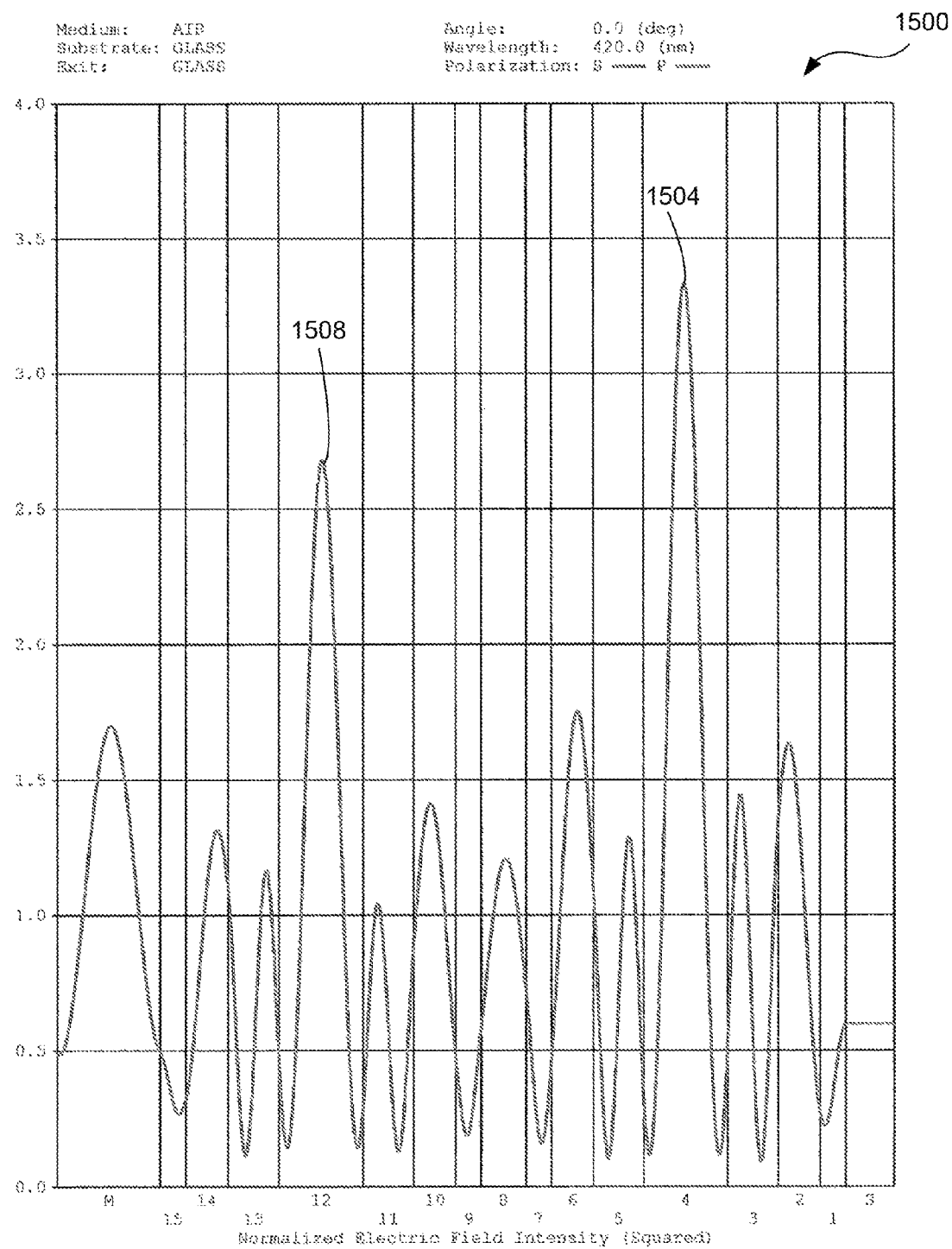
FIG. 15 is graph of electric field intensity squared versus location for the multiband resonator of FIG. 13 at the input/pump wavelength of 420 nm.
Figure 17:
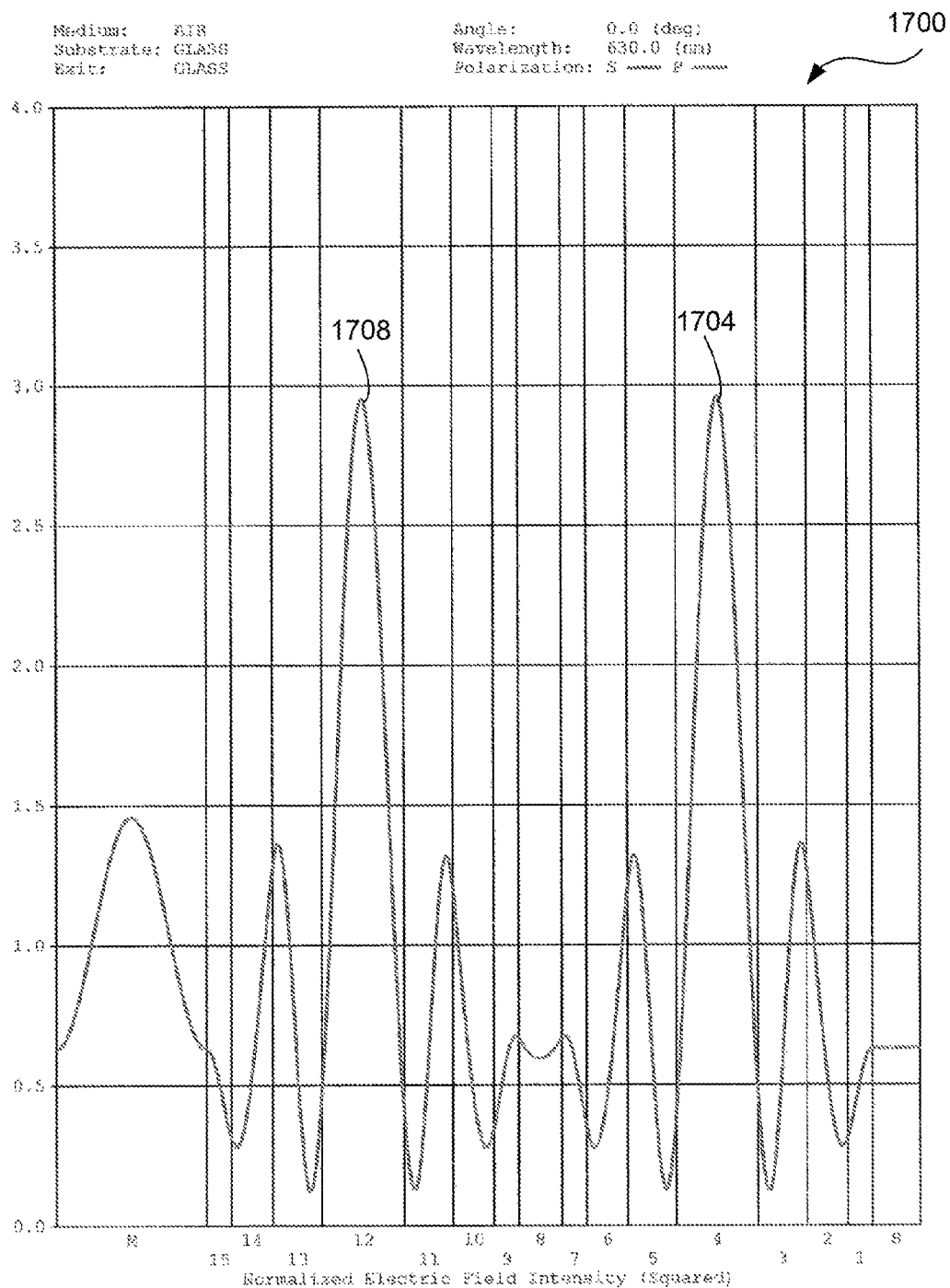
FIG. 17 is a graph of electric field intensity squared versus location for the multiband resonator of FIG. 13 at the output wavelength of 630 nm.

In this design, layers 4 and 12 become optical resonator cavities for both of the input/pump wavelength and the output wavelength. This is seen in FIGS. 15 and 17, described below.

Figure 14:
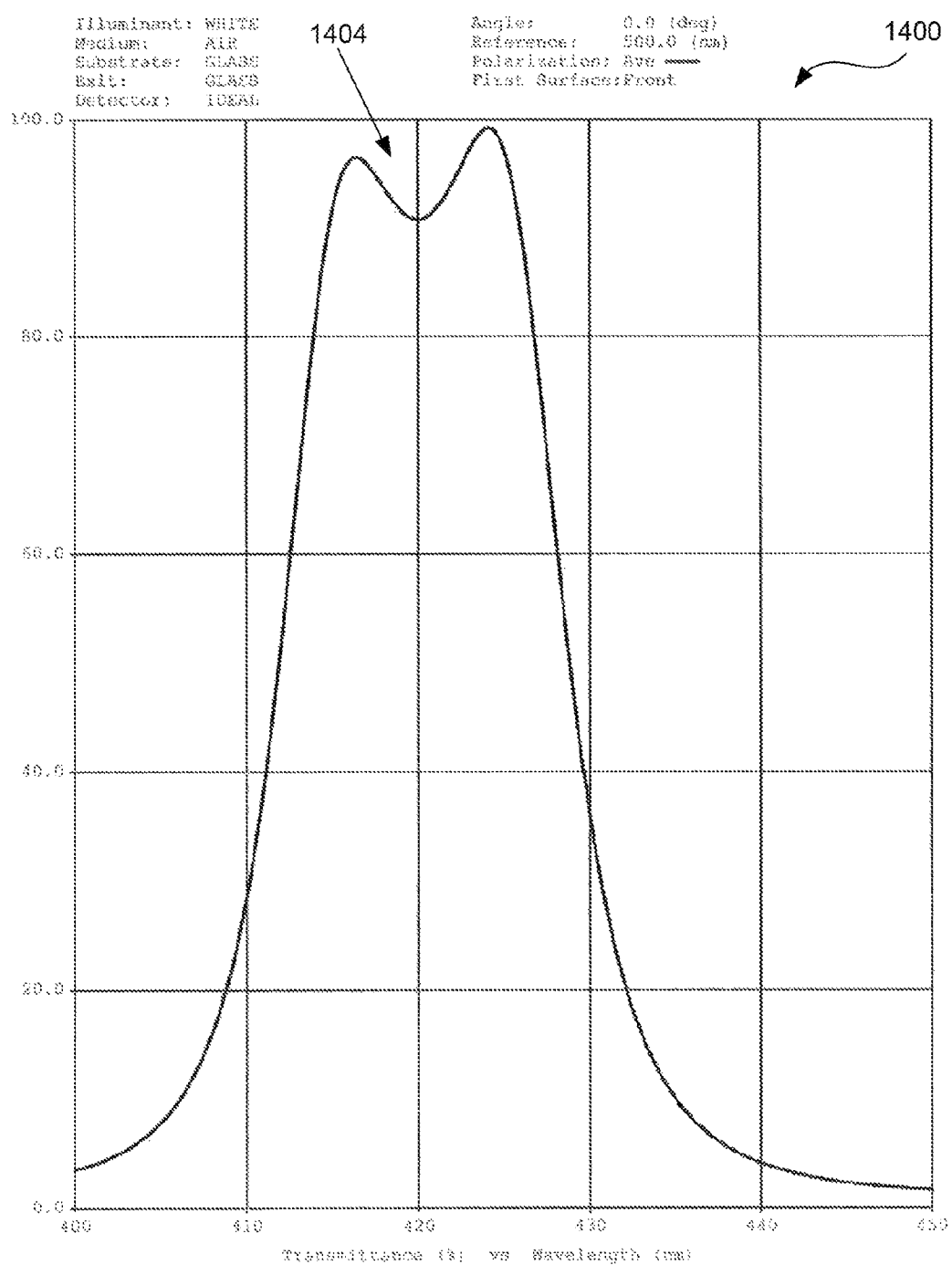
FIG. 14 is a graph of transmittance versus wavelength showing a transmittance profile of the multiband resonator of FIG. 13 at the input/pump wavelength of 420 nm.

Turning first to FIG. 14, this figure is a graph 1400 of transmittance versus wavelength for the input/pump light that shows a somewhat squared-off, dual-peaked profile 1404 that is roughly centered on the input/pump wavelength of 420 nm. FIG. 15 is a graph 1500 of normalized electric field intensity squared versus location within multiband resonator 1300 of FIG. 13. As mentioned above and as seen in FIG. 15 by the locations of peaks 1504 and 1508, layers 4 and 12 function as resonator cavities in this design. Layers 1 to 3 and 5 to 7 function as reflector pairs for resonator cavity layer 4, and, similarly, layers 9 to 11 and 13 to 15 function as reflector pairs for resonator cavity layer 12.

Figure 16:
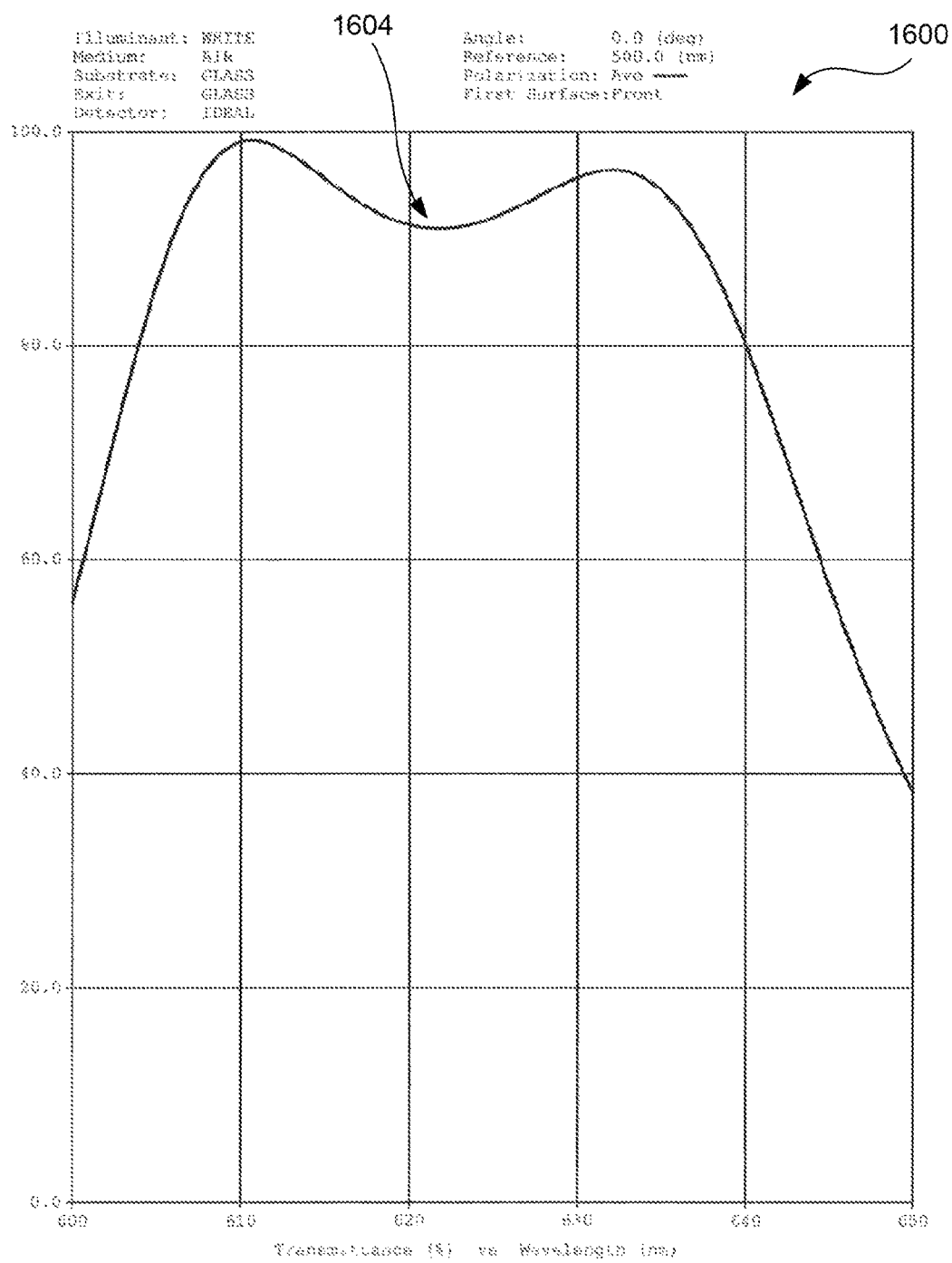
FIG. 16 is a graph of transmittance versus wavelength showing a transmission profile of the multiband resonator of FIG. 13 at the output wavelength of 630 nm.

FIG. 16 is a graph 1600 of transmittance versus wavelength for the output light that shows a somewhat squared-off, dual-peaked profile 1604 that is roughly centered on a wavelength of about 622 nm. FIG. 17 is a graph 1700 of normalized electric field intensity squared versus location within multiband resonator 1300 of FIG. 13 for the output wavelength of about 630 nm. As seen in FIG. 17 by the locations of peaks 1704 and 1708, layers 4 and 12, which function as resonator cavities for the 420 nm input light wavelength, also function as resonator cavities for the output light wavelength. As before, layers 1 to 3 and 5 to 7 function as reflector pairs for resonator cavity layer 4, and, similarly, layers 9 to 11 and 13 to 15 function as reflector pairs for resonator cavity layer 12. As those skilled in the art will readily appreciate, performance of resonator 1300 of FIG. 13 can be enhanced by locating one or more photoluminescent materials in one, the other, or both of resonator cavity layers 4 and 12.

FIG. 18 and Table IV, below, illustrate a method 1800 that can be used to fabricate a multiband resonator 1900, as seen in FIG. 19. Generally, method 1800 is directed to forming a single optical resonator cavity; however, a multi-cavity resonator can be made by adding one or more optical resonator cavities to the initial cavity shown in FIG. 19G (corresponding to quantum well stack 1920) in any suitable manner. A number of the steps of method 1800 are illustrated in corresponding respective ones of FIGS. 19A to 19G.

TABLE IV

Method 1800 of FIG. 18

| Step | FIG. | Description |
|---|---|---|
| 1805 | 19A | Select a gallium arsenide (GaAs) wafer 1904 as the starting carrier substrate. |
| 1810 | | Optionally, in-situ clean and prepare the surface 1908 of GaAs wafer 1904 for coating deposition of subsequent step. |
| 1815 | 19B | Deposit/grow quantum wells 1912 with appropriate barrier layers 1916 using a II-VI material composition (binary, ternary, or quarternary composition) on surface 1908 of GaAs wafer 1904 to create a quantum well stack 1920. The thickness, number of quantum well(s) 1912 and barrier layers 1916 and locations of the layer will be predetermined by design for the desired wavelength(s) of operation, pump wavelength, etc. These quantum well(s) 1912 will serve as the photoluminescent phosphor layer (or gain media). |
| 1820 | 19C | Deposit a first reflector coating stack 1924 atop quantum well stack 1920. First reflector coating stack 1924 is designed such that, upon device completion, the optical resonator 1900 (FIG. 19G) constructively resonates for both the input/pump wavelength and the output wavelengths simultaneously. |
| 1825 | 19D | Optionally, attach/bond a suitable heat-sink layer 1932 on top of first reflector coating stack 1924. |
| 1830 | 19E | Attach/bond a suitable permanent substrate 1936 on top of first reflector coating stack 1924 or heat-sink layer 1932, if present. |
| 1835 | 19F | Remove starting GaAs carrier wafer 1904 (FIG. 19E) by back thinning, leaving behind the stack 1940 of coatings from steps 1815, 1820, and 1825. |
| 1840 | 19G | Deposit a second reflector coating stack 1944 atop the now exposed coating stack 1940. Second reflector coating stack 1944 is designed such that, upon device completion, optical resonator 1900 constructively resonates for both the input/pump wavelength and the output wavelengths simultaneously. |
| 1845 | | Optionally, deposit additional optical cavities resonators (not shown) with or without one or more additional phosphor layers, if so desired. |
| 1850 | | Further process the assembly as desired to create functional devices, etc. For example, add pump-light source (see, e.g., light source(s) 108 of FIG. 1), perform QC measurements, package, ship, etc. |

Those skilled in the art will readily appreciate that method 1800 is merely illustrative and is not limiting. Indeed, there are many possible variations to the steps and materials provided in this explicit example. Some of these variations are described below to give the reader a sense of the alternatives available. GaAs carrier substrate 1904 may be replaced by another suitable carrier substrate, such as a substrate made of Si, Ge, SiGe, InP, GaSb, or any other suitable material, for example, any of the materials revealed in the '135 application, which is incorporated herein by reference for the disclosure of carrier substrate materials.

It is noted that if the carrier substrate is transparent (e.g., a wide band gap substrate, not absorbing of the input/pump wavelength), it might not need to be removed at step 1835.

Also starting carrier substrate 1904 may be completely back thinned or only partially back thinned depending on substrate choice and design. Quantum wells 1912 may be replaced by any other quantum-confining layer. Additionally, combinations of quantum wells, quantum dots, etc. may be mixed together if so desired. Furthermore, the number of quantum wells or quantum-confining layers used in the device structure may be one or any number greater than one.

If a II-VI material is used, the II-VI coating layer structure may be zinc blende or wurtzite. As an example, CdS may be used for barrier layers 1912, and CdSe may be used for quantum-well layers 1908. Each barrier layer may be composed of a semiconductor or insulator material. Other III-V materials that can be used for quantum confining layers include, for example, GaN, AlGaN, InGaN, BN, and any other material called out for the quantum-confining materials in the '135 application, which is incorporated herein by reference for such materials.

Currently the industry is lacking suitable green LEDs and LDs, whereas blue and violet LEDs and LDs are widely available. The structure of optical resonator 1900 of FIG. 19, as depicted above, may be used to downconvert a pump blue/violet LED or LD to generate green or red or even better blue LEDs and LDs. One of the biggest contemporary challenges in realizing an InGaN-based green LED is the migration of the indium from the quantum wells under the high temperatures used in processing the device. Clearly the photoluminescent-phosphor-based downconversion solution of the present embodiment does not need the p- and n-type layers bounding the InGaN, as is usual in a conventional electroluminescent device. So one can simply implement InGaN quantum wells that are already realizable using established infrastructure and processing in optical resonator designs disclosed herein to realize long-lasting, high-quality green LEDs and LDs.

The band gaps of the quantum wells material(s) and the barrier layer material(s) may be chosen so that the input/pump wavelength are absorbed only in the quantum well layers or also in the barrier layers. The quantum wells (if more than one) may be all of the same thickness or different thicknesses and/or compositions. Similarly the barrier layers may be all of the same thickness or different thicknesses and/or compositions. Each quantum well may or may not be located at an anti-node of the standing wave in the resonator cavity.

The heat sink or heat spreading material in heat-sink layer 1932 may be made up of any material listed in the carrier substrate materials section of the '135 application, which is incorporated herein by reference for such listing. In particular examples, the material may be uncoated sapphire, silicon carbide, diamond, diamond-like coating, graphite, graphene, mica, etc.

Figure 19A:
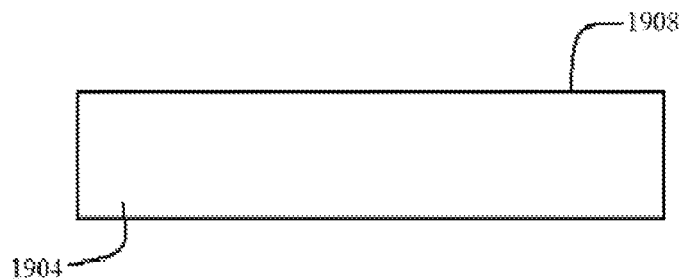
FIGS. 19A to 19G are diagrams illustrating various steps of the method of FIG. 18.
Figure 19B:
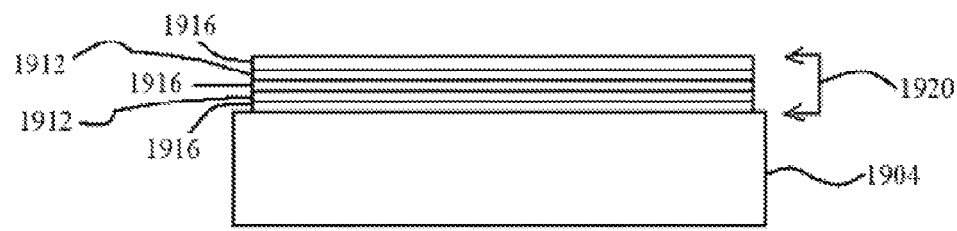
Figure 19C:
Figure 19D:
Figure 19E:
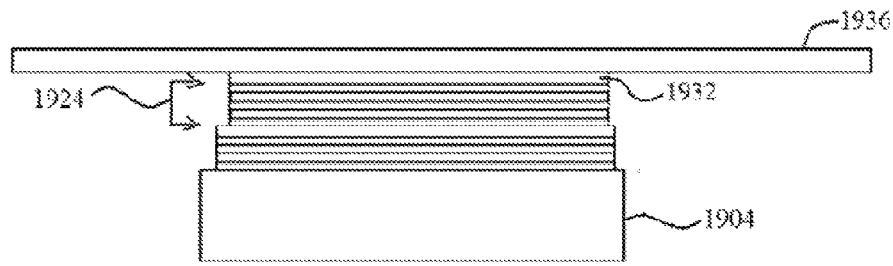
Figure 19F:
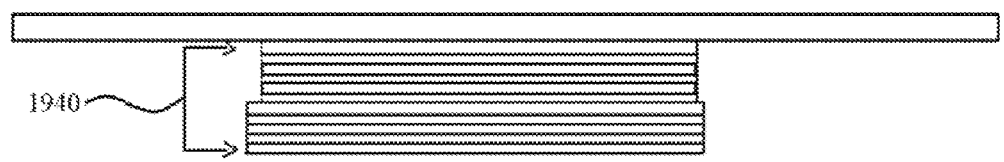
Figure 19G:
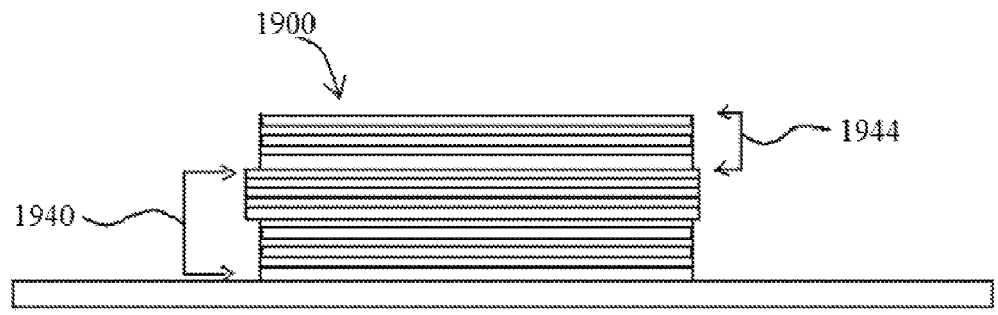

The reflector coating stacks, such as reflector coating stacks 1924 and 1944 of FIGS. 19C and 19G, may be made up of metals, semiconductors or insulator (dielectric) layers. In one example, each reflector coating stack is made of insulating or wide bandgap semiconductors (i.e., not absorbing of the input/pump wavelengths).

As noted above, the maximum electric field peak or any other sub-ordinate peak (side lobes) can be used to tailor the required absorption desired in the quantum-well photoluminescent phosphor material. The output wavelength(s) may be blue, green, red, or any wavelength in the near-infrared. The output wavelength may also be a combination of blue and green, or blue and red, or green and red, or blue, green, and red (white light) or any other combination, as desired in the visible and near-infrared region of the electromagnetic spectrum. Basically, the pump/input wavelength(s) can be any wavelength from deep ultraviolet, ultraviolet, violet, visible, to near-infrared and the output wavelength(s) can be any wavelengths from the deep ultraviolet, ultraviolet, violet, visible, to near-infrared or combinations of more than one wavelength(s) as dictated by choice of phosphors and designs. Furthermore, the output wavelengths can be tailored in terms of wavelength and bandwidth by choice of judicious design of the quantum confining layer/barrier layers to generate a specific complex refractive index. The output wavelength can be designed for a specific polarization. The revealed architecture could be used to create novel optically pumped VCSELs, VECSELs, OPS-VECSELs, VCSOAs, OPSL, SDL, etc. It could also be used to enhance the efficiency of phenomena such as superradiance, superfluorescence, coherence brightening, amplified spontaneous emission, optical gain, etc.

As seen above, Tables II and III defined a particular example of optical resonator 1300 of FIG. 13 in terms of parameters for the TFCALC™ software mentioned above. Tables V and VI, below, provide a second particular example of optical resonator 1300; Tables VII and VIII, below, provide a third particular example of optical resonator 1300; and Tables IX and X, below, provide a fourth particular example of optical resonator 1300. As seen, these differing designs are for differing input and output wavelengths.

TABLE V

PARAMETERS FOR TFCALC ™ SOFTWARE

| | |
|---|---|
| Input light wavelength | ~440 nm |
| Output light wavelength | ~578 nm |
| Refractive index of high-index (H) material | 2.422 @ 500 nm |
| Refractive index of low-index (L) material | 1.459 @ 500 nm |
| Refractive index of medium-index (M) material | 1.38 @ 550 nm |
| Coating substrate | Glass |
| Incident medium | Air |
| Exit medium | Glass |

TABLE VI

COATING DESIGN FOR TFCALC ™ SOFTWARE

| Layer | Refractive Index | Thickness (nm) |
|---|---|---|
| 1 | H | 51.61 |
| 2 | L | 85.68 |
| 3 | H | 206.44 |
| 4 | L | 171.35 |
| 5 | H | 206.44 |
| 6 | L | 85.68 |
| 7 | H | 51.61 |
| 8 | M | 90.58 |
| 9 | H | 51.61 |
| 10 | L | 85.68 |
| 11 | H | 206.44 |
| 12 | L | 171.35 |
| 13 | H | 206.44 |
| 14 | L | 85.68 |
| 15 | H | 51.61 |

TABLE VII

PARAMETERS FOR TFCALC ™ SOFTWARE

| | |
|---|---|
| Input light wavelength | ~434 nm |
| Output light wavelength | ~590 nm |
| Refractive index of high-index (H) material | 2.422 @ 500 nm |
| Refractive index of low-index (L) material | 1.459 @ 500 nm |
| Refractive index of medium-index (M) material | 1.38 @ 550 nm |

TABLE VII-continued

PARAMETERS FOR TFCALC ™ SOFTWARE

| | |
|---|---|
| Coating substrate | Glass |
| Incident medium | Air |
| Exit medium | Glass |

TABLE VIII

COATING DESIGN FOR TFCALC ™ SOFTWARE

| Layer | Refractive Index | Thickness (nm) |
|---|---|---|
| 1 | H | 51.61 |
| 2 | L | 85.68 |
| 3 | H | 103.22 |
| 4 | L | 342.70 |
| 5 | H | 103.22 |
| 6 | L | 85.68 |
| 7 | H | 51.61 |
| 8 | M | 90.58 |
| 9 | H | 51.61 |
| 10 | L | 85.68 |
| 11 | H | 103.22 |
| 12 | L | 342.70 |
| 13 | H | 103.22 |
| 14 | L | 85.68 |
| 15 | H | 51.61 |

TABLE IX

PARAMETERS FOR TFCALC ™ SOFTWARE

| | |
|---|---|
| Input light wavelength | ~448 nm |
| Output light wavelength | ~556 nm |
| Refractive index of high-index (H) material | 2.422 @ 500 nm |
| Refractive index of low-index (L) material | 1.459 @ 500 nm |
| Refractive index of medium-index (M) material | 1.38 @ 550 nm |
| Coating substrate | Glass |
| Incident medium | Air |
| Exit medium | Glass |

TABLE X

COATING DESIGN FOR TFCALC ™ SOFTWARE

| Layer | Refractive Index | Thickness (nm) |
|---|---|---|
| 1 | H | 51.61 |
| 2 | L | 171.35 |
| 3 | H | 51.61 |
| 4 | L | 342.70 |
| 5 | H | 51.61 |
| 6 | L | 171.35 |
| 7 | H | 51.61 |
| 8 | M | 90.58 |
| 9 | H | 51.61 |
| 10 | L | 171.35 |
| 11 | H | 51.61 |
| 12 | L | 342.70 |
| 13 | H | 51.61 |
| 14 | L | 171.35 |
| 15 | H | 51.61 |

The present inventor submits that the multiband resonator architecture revealed above in connection with FIG. 13 can be optimized to create a polariton-based LED or LD type optoelectronic device. As revealed in great detail in connection with multiband resonator of FIG. 13, the reflector coating stacks for the optical resonator cavities can be designed such that, upon device completion, the optical resonator will constructively resonate for not only the input pump but also the output wavelength(s) simultaneously. The construction therefore enables the co-localization of excitons and photons. Excitons are created by the absorbed input/pump wavelength in the quantum confining layers (e.g., quantum wells 1908 in FIG. 19B) and the photons (of the output wavelength(s)) resonate maximally in the same quantum confining layers. This creates the co-localization scenario for the excitons and photons.

In addition to the forgoing four particular examples of optical resonator 1300 of FIG. 13 that were modeled in the TFCALC™ software using, respectively, the parameters of Tables II and III, Tables V and VI, Tables VII and VIII, and Tables IX and X, following are four additional specific exemplary resonator designs that the present inventor has modeled using the TFCALC™ software.

Design No. 1

This design depicts an exemplary multi-cavity optical resonator having high absorption at the pump wavelength and high transmission at output wavelengths. This type of resonator architecture may be used for a downconverted LED, as an example. It is noted that this design uses only a single photoluminescent phosphor absorbing layer of CdSe that is about 3 nm in thickness. This thin layer represents the typical quantum-well thickness (rough order of magnitude) gain medium. As is typical for any gain medium, there is absorption as well as emission from the media. This design also uses insulator (dielectric) materials, but as those skilled in the art will readily appreciate, the architecture can be extended to typical semiconductor used to manufacture LEDs, LDs, etc. All reflectivity calculations assumed that the coatings are deposited on a glass substrate having a refractive index of ~1.5.

The design, in the nomenclature of the TFCALC™ software, is Glass/H2LHL H4LHL H1.9L 0.2365H (CdSe—3 nm) 0.2365H 1.85L HLH2LH/Air, with: the high-index (H) material being ZnS having a refractive index of ~2.3633 @ 600 nm and k~$10^{-6}$; the low-index (L) material being cryolite having a refractive index of ~1.345 @ 600 nm and k~$10^{-6}$; and the absorbing layer of CdSe having a refractive index of ~2.7501 and k~0.347. The reference wavelength for this design is 600 nm.

Figure 20:
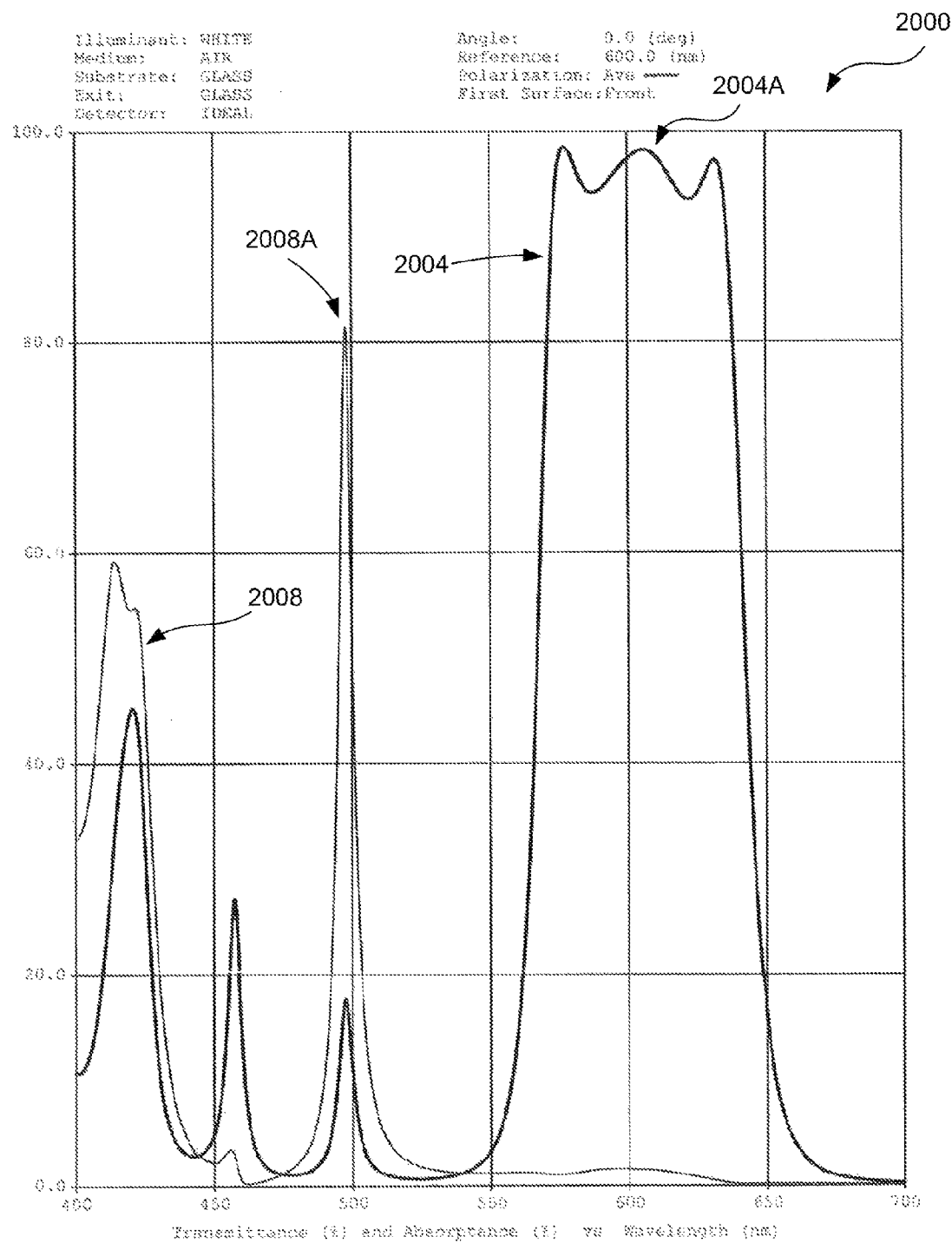
FIG. 20 is a graph of transmittance and absorptance versus wavelength for an exemplary multi-cavity resonator (Design 1)

FIG. 20 is a graph 2000 of transmittance and absorptance versus wavelength showing a transmittance spectral plot 2004 and an absorptance spectral plot 2008 for Design 1. As readily seen, transmittance spectral plot 2004 has a triplet peak 2004A for the output light wavelength band that is centered at about 610 nm, and absorptance spectral plot 2008 has a peak 2008A at about 497 nm, which is the input/pump wavelength.

Design No. 2

This design depicts an exemplary multi-cavity optical resonator having high absorption at the pump wavelength and high transmission at output wavelengths. This type of resonator architecture may be used for a downconverted LED, as an example. It is noted that this design uses only a single photoluminescent phosphor absorbing layer of CdSe that is about 3 nm in thickness. This thin layer represents the typical quantum-well thickness (rough order of magnitude) gain medium. As is typical for any gain medium, there is absorption as well as emission from the media. This design also uses insulator (dielectric) materials, but as those skilled in the art will readily appreciate, the architecture can be extended to typical semiconductors used to manufacture LEDs, LDs, etc. All reflectivity calculations assumed that the coatings are deposited on a glass substrate having a refractive index of ~1.5.

The design, in the nomenclature of the TFCALC™ software, is Glass/H2LHL H2LHL H2LHL H 0.5429L 0.2633H (CdSe—3 nm) 0.2633H 0.5L 0.7HLH2LH/Air, with: the high-index (H) material being ZnS having a refractive index of ~2.3633 @ 600 nm and k~$10^{-6}$; the low-index (L) material being cryolite having a refractive index of ~1.345 @ 600 nm and k~$10^{-6}$; and the absorbing layer of CdSe having a refractive index of ~2.7501 and k~0.347. The reference wavelength for this design is 545 nm.

Figure 21:
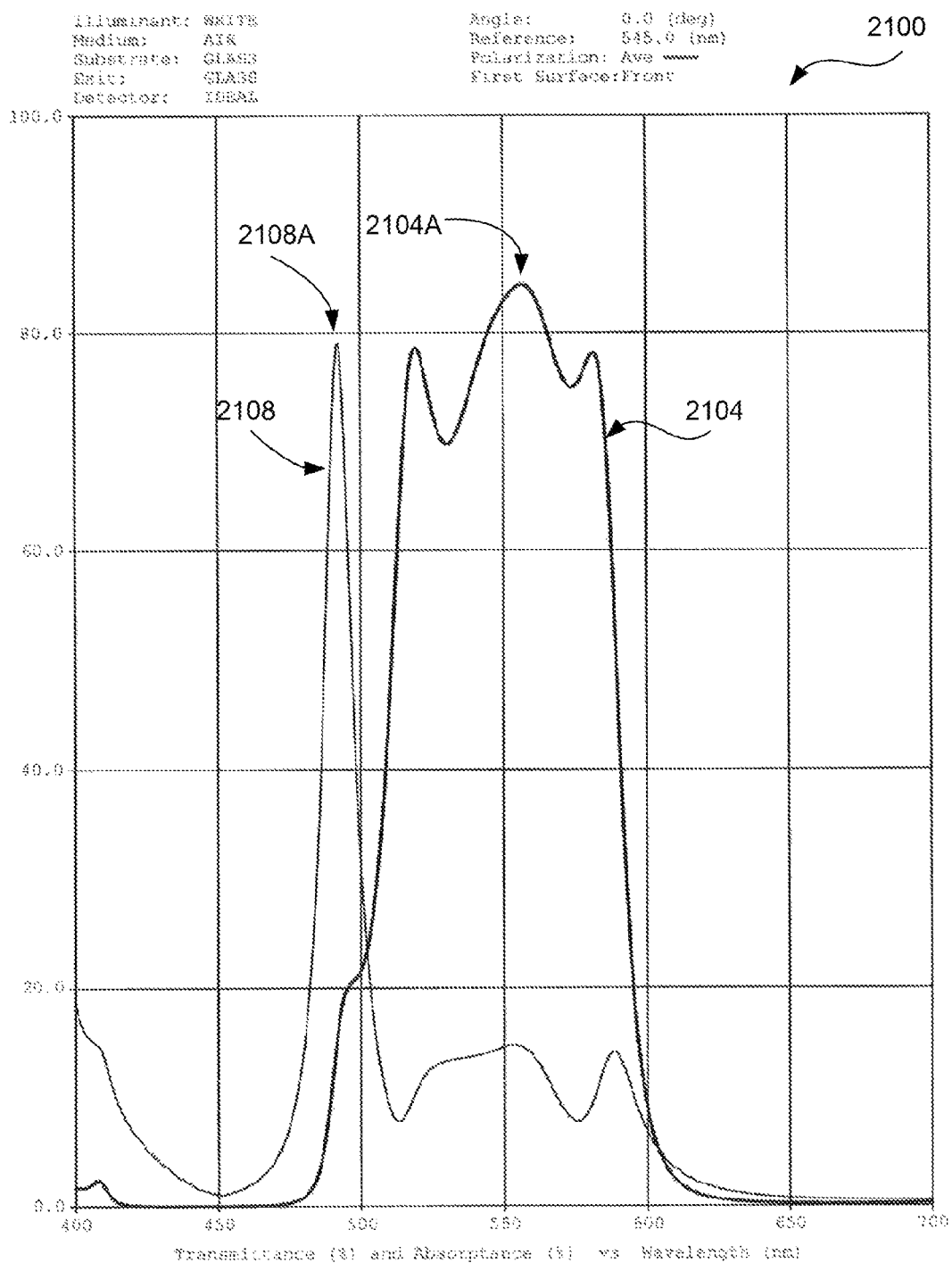
FIG. 21 is a graph of transmittance and absorptance versus wavelength for another exemplary multi-cavity resonator (Design 2)

FIG. 21 is a graph 2100 of transmittance and absorptance versus wavelength showing a transmittance spectral plot 2104 and an absorptance spectral plot 2108 for Design 2. As readily seen, transmittance spectral plot 2104 has a triplet peak 2104A at the output light wavelength band that is centered at about 550 nm, and absorptance spectral plot 2108 has a peak 2108A at about 492 nm, which is the input/pump wavelength. Comparing graph 2100 of FIG. 21 to graph 2000 of FIG. 20, it is noted how pump wavelength peak 2108A and output wavelengths peak 2104A (FIG. 21) of Design 2 are much closer to each other than pump wavelength peak 2008A and output wavelengths peak 2004A (FIG. 20) of Design 1. Thus, Design 2 has a significantly smaller Stokes shift loss than compared to Design 1.

Design No. 3

This design depicts an exemplary multi-cavity optical resonator having high absorption at the pump wavelength and high transmission at output wavelengths. This type of resonator architecture may be used for a downconverted LED, as an example. It is noted that this design uses two photoluminescent phosphor absorbing layers of CdSe that are each about 5 nm in thickness. The thinness of each of these layers represents the typical quantum-well thickness (rough order of magnitude) gain medium. As is typical for any gain medium, there is absorption as well as emission from the media. This design also uses insulator (dielectric) materials, but as those skilled in the art will readily appreciate, the architecture can be extended to typical semiconductor used to manufacture LEDs, LDs, etc. All reflectivity calculations assumed that the coatings are deposited on a glass substrate having a refractive index of ~1.5.

The design, in the nomenclature of the TFCALC™ software, is Glass/H2LHL H2LHL H2LHL H 0.0083L 0.1445H (CdSe—5 nm) 0.1445H (CdSe—5 nm) 0.1445H L 1.85H/Air, with: the high-index (H) material being ZnS having a refractive index of ~2.3633 @ 600 nm and k~$10^{-6}$; the low-index (L) material being cryolite having a refractive index of ~1.345 @ 600 nm and k~$10^{-6}$; and the absorbing layer of CdSe having a refractive index of ~2.7501 and k~0.347. The reference wavelength for this design is 650 nm.

Figure 22:
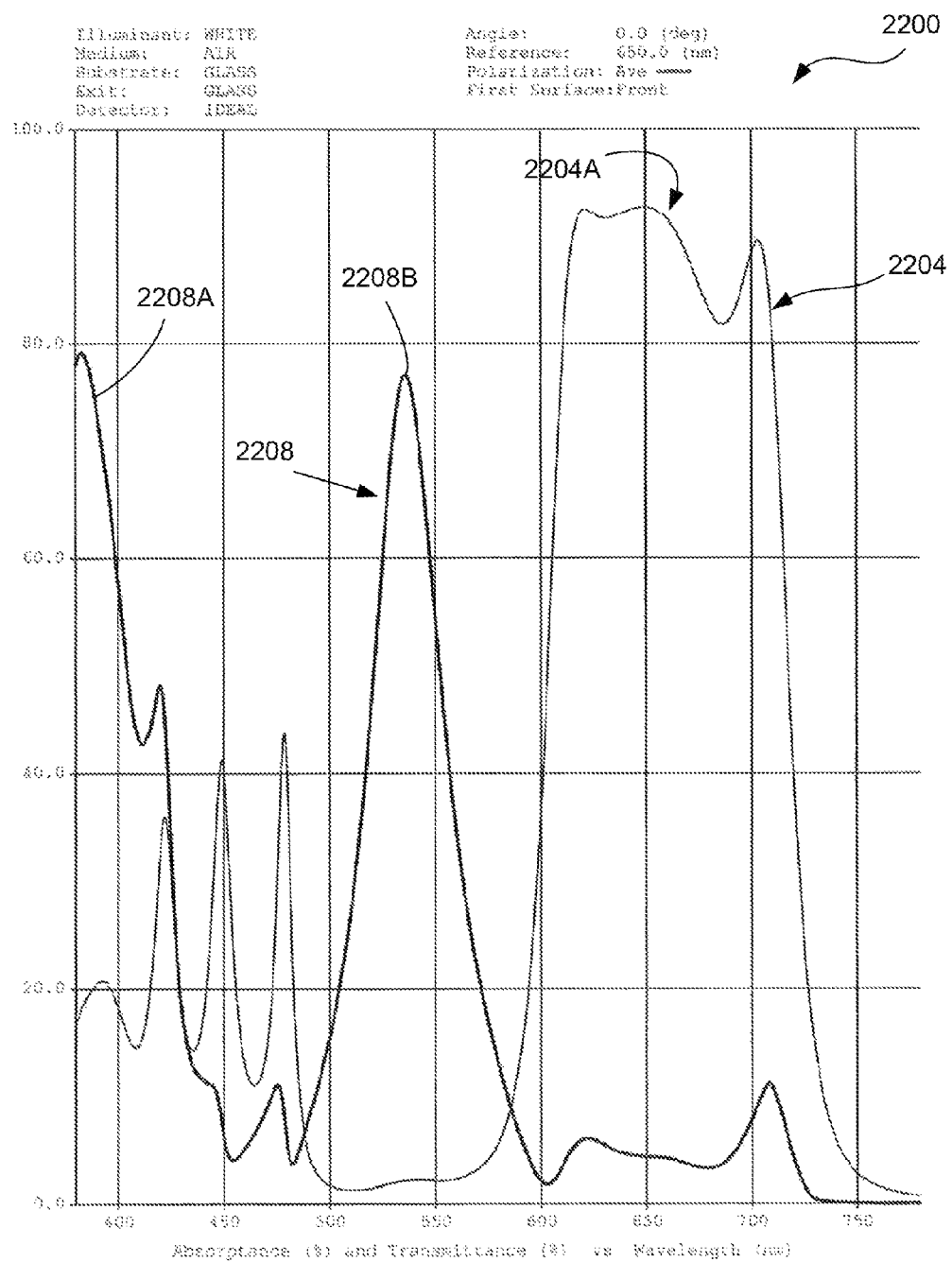
FIG. 22 is a graph of transmittance and absorptance versus wavelength for a further exemplary multi-cavity resonator (Design 3)

FIG. 22 is a graph 2200 of transmittance and absorptance versus wavelength showing a transmittance spectral plot 2204 and an absorptance spectral plot 2208 for Design 3. As readily seen, transmittance spectral plot 2204 has somewhat of a triplet peak 2204A centered at about 660 nm for the output light, and absorptance spectral plot 2208 has two prominent peaks 2208A and 2208B at about 385 nm and 535 nm, respectively, with peak 2208B being at the input/pump wavelength.

Design No. 4

This design depicts an exemplary multi-cavity optical resonator having high absorption at the pump wavelength and high reflectance at output wavelengths. This type of resonator architecture may be used for a downconverted LD, as an example. It is noted that this design uses only a single photoluminescent phosphor absorbing layer of CdSe that is about 3 nm in thickness. This thin layer represents the typical quantum-well thickness (rough order of magnitude) gain medium. As is typical for any gain medium, there is absorption as well as emission from the media. This design also uses insulator (dielectric) materials, but as those skilled in the art will readily appreciate, the architecture can be extended to typical semiconductors used to manufacture LEDs, LDs, etc. All reflectivity calculations assumed that the coatings are deposited on a glass substrate having a refractive index of ~1.5.

The design, in the nomenclature of the TFCALC™ software, is Glass/H2LHL H2LHL H 0.85L HLH 0.5828L 0.2633H (CdSe—3 nm) 0.2633H 0.5L 0.3H LH 0.85L H/Air, with: the high-index (H) material being ZnS having a refractive index of ~2.3633 @ 600 nm and k~$10^{-6}$; the low-index (L) material being cryolite having a refractive index of ~1.345 @ 600 nm and k~$10^{-6}$; and the absorbing layer of CdSe having a refractive index of ~2.7501 and k~0.347. The reference wavelength for this design is 545 nm.

Figure 23:
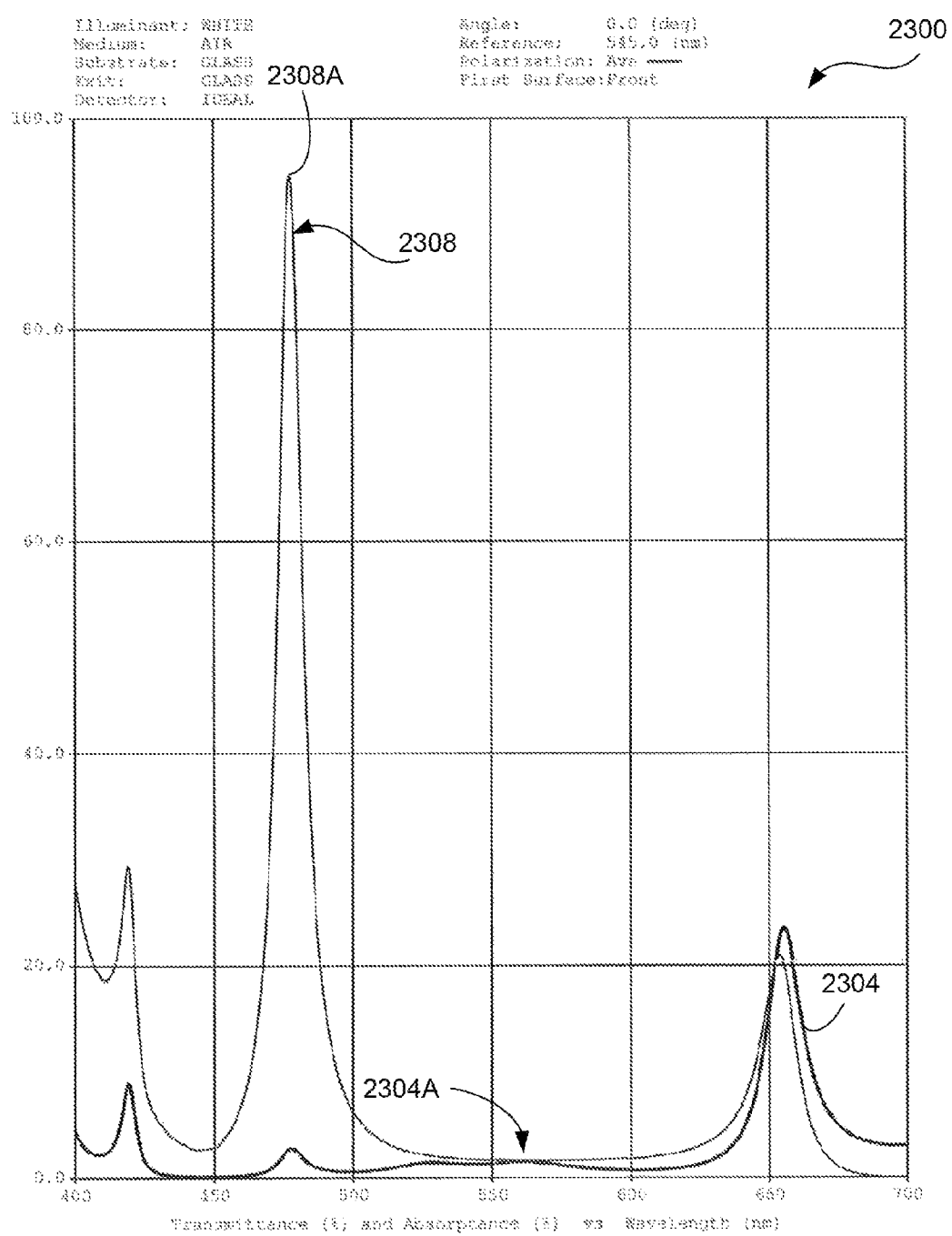
FIG. 23 is a graph of transmittance and absorptance versus wavelength for still another exemplary multi-cavity resonator (Design 4)
Figure 24:
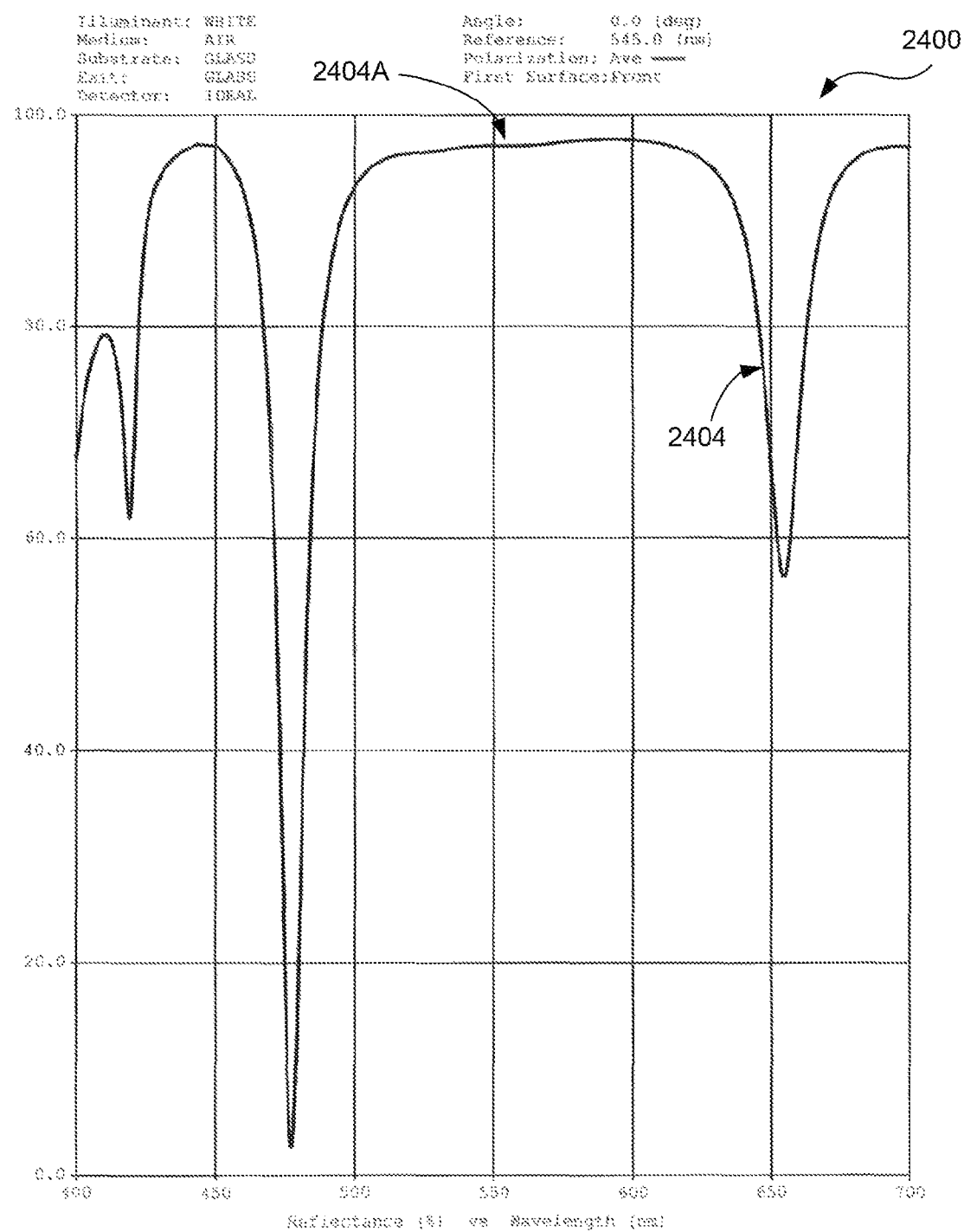
FIG. 24 is a graph of reflectance versus wavelength for the exemplary multi-cavity resonator corresponding to the graph of FIG. 23 (Design 4)

FIG. 23 is a graph 2300 of transmittance and absorptance versus wavelength showing a transmittance spectral plot 2304 and an absorptance spectral plot 2308 for Design 4. FIG. 24 is a graph 2400 of reflectance versus wavelength for Design 4. As seen from graph 2300 of FIG. 23, Design 4 has an absorptance peak 2308A at the input/pump wavelength of about 477 nm, but transmittance spectral plot 2304 is rather flat in the region 2304A of the output light wavelength band of about 525 nm to about 610 nm. However, as seen from graph 2400 of FIG. 24, Design 4 has a high reflectance in the output light wavelength band, as indicated by broad peak 2404A of the reflectance spectral plot 2404.

Figure 25:
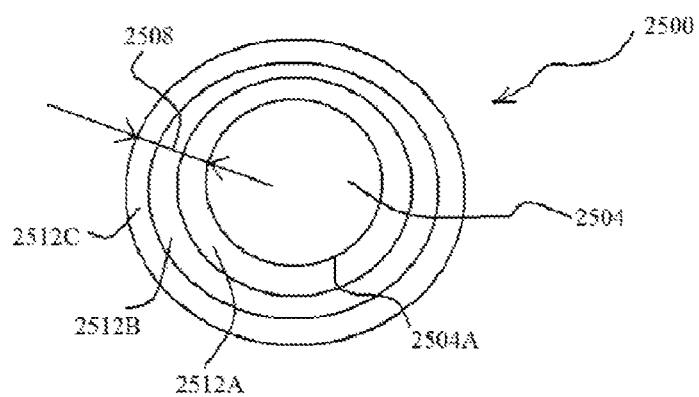
FIG. 25 is a diagram of a quantum dot having integrated reflectors.

As mentioned above, various embodiments of the optical resonator architectures disclosed herein utilize quantum-confining structures as photoluminescent absorbing structures, including quantum dots. When quantum dots are used in those embodiments, it is generally contemplated that they are used in their initial form, i.e., without any surface coatings. However, in other embodiments the present inventor proposes use of specially processed quantum dots having integrated reflectors applied to their surfaces. FIG. 25 illustrates a reflectorized quantum dot 2500 that illustrates this.

As seen in FIG. 25, reflectorized quantum dot 2500 comprises a generally spherical quantum dot 2504 and a reflector 2508 applied to the surface 2504A of the quantum dot. Quantum dot 2504 can be composed of any suitable material, such as, but not limited to, the materials listed on pages 41 and 42 of the '135 application, which is incorporated herein by reference for its teachings of suitable quantum dot materials and techniques for forming quantum dots. In this example, reflector 2508 is a DBR comprising a plurality of layers, here layers 2512A to 2512C, of differing refractive indexes. Those skilled in the art will readily be able to determine the materials to use for layers 2512A to 2512C, some of which are disclosed in some of the examples above. Layers 2512A to 2512C can be applied to quantum dot 2504 in any suitable manner to create reflectorized quantum dot 2500. As those skilled in the art will readily appreciate, spherical reflector 2508 surrounding quantum dot 2504 effectively functions as an infinite number of diametrically opposed mirror pairs in all directions throughout the volume of the quantum dot, thereby placing the quantum dot (i.e., the photoluminescent material, depending on the wavelength of the pumping light) within an omnidirectional optical resonator cavity.

Figure 26:
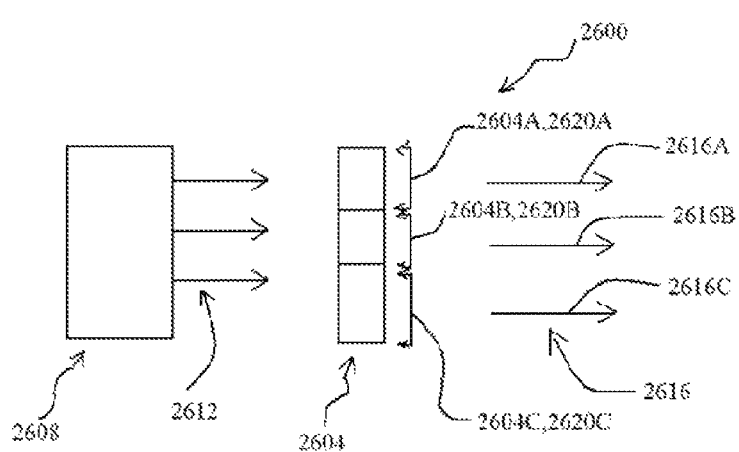
FIG. 26 is a high-level schematic diagram of a red-green-blue (RGB) light-emitting system made in accordance with the present invention.
Figure 27:
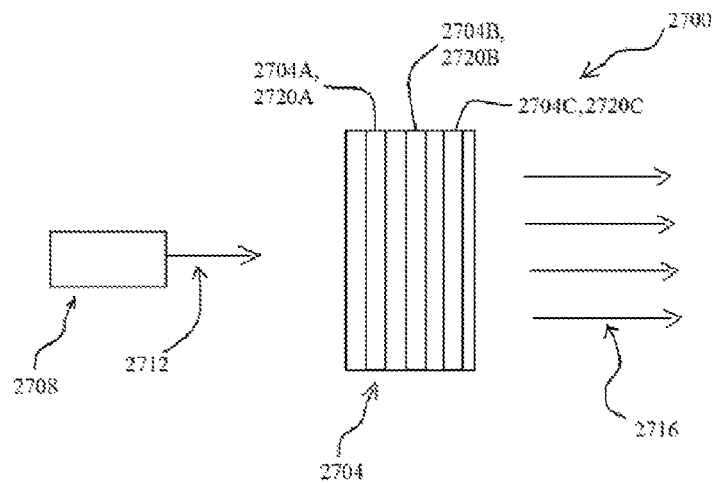
FIG. 27 is a high-level schematic diagram of another RGB light-emitting system made in accordance with the present invention.

FIGS. 26 and 27 illustrate multicolor light-emitting systems 2600, 2700, respectively, that can be made using multi-cavity and/or multiband resonators disclosed herein. Referring first to FIG. 26, system 2600 includes a multi-wavelength downconverting resonator structure 2604 and a light source 2608 that provides input pumping light 2612 to the resonator structure. In response to pumping light 2612, resonator structure 2604 outputs light 2616 at certain predetermined wavelengths, i.e., light of differing colors. In the present example, resonator structure 2604 comprises red, green, and blue (RGB) downconverters 2604A, 2604B, and 2604C that output, respectively, RGB light 2616A, 2616B, and 2616C. Of course, other colors, number of colors, and color combinations are possible; RGB downconverters 2604A, 2604B, and 2604C are simply used as an example do to the ubiquity of RGB light-emitters in electronic displays and other devices.

RGB downconverters 2604A, 2604B, and 2604C can be implemented in corresponding respective individual multi-cavity and/or multiband resonators 2620A, 2620B, and 2620C each tuned to the particular wavelengths of input light and output light 2616A, 2616B, and 2616C. In such embodiments, each multi-cavity and/or multicavity resonator 2620A, 2620B, and 2620C can be made using techniques disclosed above. In other embodiments, RGB downconverters 2604A, 2604B, and 2604C can be implemented as portions within a common resonator, for example, using techniques involving using photoluminescent layers of variable thickness as described above in connection with FIG. 12.

Input light 2612 can be at any one or more wavelengths, as needed to suit a particular design. In some embodiments, light source 2608 is an LD or LED emitting so that pumping light 2612 is at a single primary wavelength. Each LD or LED can be, for example, a wide-area source that has an emitting area that substantially corresponds to the area of resonator structure 2604. If light source 2604 emits a relatively narrow beam (not shown) of light relative to the area of resonator structure 2604, it can utilize a suitable beam expander (not shown), as known in the art. In other embodiments, light source 2604 may be composed of one or more individual light sources (not shown) for each of RGB downconverters 2604A, 2604B, and 2604C. In such embodiments, such light sources can all emit light at the same primary wavelength, or they could emit light at different wavelengths, with each wavelength selected based on the design of the corresponding RGB downconverters 2604A, 2604B, and 2604C.

Referring now to FIG. 27, exemplary multicolor light-emitting system 2700 is similar to light-emitting system 2600 of FIG. 26, except that in FIG. 27, the configuration of multi-wavelength downconverting resonator structure 2704 has RGB downconverters 2704A, 2704B, and 2704C in series with one another (relative to the directionality of pumping light 2712 from light source 2708), rather than in parallel with one another, as is the case of RGB downconverters 2604A, 2604B, and 2604C of FIG. 26 relative to pumping light 2612. Other aspects of multicolor light-emitting system 2700 of FIG. 7 can be the same as the corresponding aspect of system 2600 of FIG. 26.

For example, in response to pumping light 2712, resonator structure 2704 outputs mixed RGB light 2716 at certain predetermined wavelengths, i.e., light of differing colors. In the present example, resonator structure 2704 comprises red, green, and blue (RGB) downconverters 2704A, 2704B, and 2704C that output mixed RGB light 2716. Of course, other colors, number of colors, and color combinations are possible; RGB downconverters 2704A, 2704B, and 2704C are simply used as an example do to the ubiquity of RGB light-emitters in electronic displays and other devices.

RGB downconverters 2704A, 2704B, and 2704C can be implemented in corresponding respective individual multi-cavity and/or multiband resonators 2720A, 2720B, and 2720C each tuned to the particular wavelengths of input light and output light. In such embodiments, each multi-cavity and/or multicavity resonator 2720A, 2720B, and 2720C can be made using techniques disclosed above.

Input light 2712 can be at any one or more wavelengths, as needed to suit a particular design. In some embodiments, light source 2708 is an LD or LED emitting so that pumping light 2712 is at a single primary wavelength. Each LD or LED can be, for example, a wide-area source that has an emitting area that substantially corresponds to the area of resonator structure 2704. If light source 2704 emits a relatively narrow beam (not shown) of light relative to the area of resonator structure 2704, it can utilize a suitable beam expander (not shown), as known in the art. In other embodiments, light source 2704 may be composed of one or more individual light sources (not shown) for each of RGB downconverters 2704A, 2704B, and 2704C. In such embodiments, such light sources can all emit light at the same primary wavelength, or they could emit light at different wavelengths, with each wavelength selected based on the design of the corresponding RGB downconverters 2704A, 2704B, and 2704C.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of forming an optical resonator system designed and configured to receive input light of a first wavelength and output output light of a second wavelength, wherein the first and second wavelengths differ from one another, the method comprising:
    arranging a plurality of reflectors to define a plurality of optical resonator cavities configured as a function of the input light and the output light;
    locating a photoluminescent layer between a pair of the plurality of reflectors, wherein the photoluminescent layer is selected to photoluminesce in the presence of the input light.

2. A method according to claim 1, wherein said arranging a plurality of reflectors and said locating a photoluminescent layer include making the plurality of reflectors and the photoluminescent layer monolithic with one another.

3. A method according to claim 1, wherein said arranging a plurality of reflectors and said locating a photoluminescent layer include not making the plurality of reflectors and the photoluminescent layer monolithic with one another.

4. A method according to claim 1, wherein said arranging the plurality of reflectors includes forming a plurality of distributed Bragg reflectors using thin films and configuring the plurality of distributed Bragg reflectors as a function of the input light and the output light.

5. A method according to claim 1, wherein said arranging the plurality of reflectors includes forming a plurality of non distributed Bragg reflectors using thin films and configuring the plurality of non distributed Bragg reflectors as a function of the input light and the output light.

6. A method according to claim 1, wherein said arranging the plurality of reflectors includes arranging the plurality of reflectors so that at least one of the plurality of optical resonator cavities resonates at the first wavelength and not at the second wavelength.

7. A method according to claim 1, wherein said arranging the plurality of reflectors includes arranging the plurality of reflectors so that at least one of the plurality of optical resonator cavities resonates at the second wavelength and not at the first wavelength.

8. A method according to claim 1, wherein said arranging the plurality of reflectors includes arranging the plurality of reflectors so that the plurality of optical resonator cavities are spaced from one another.

9. A method according to claim 8, wherein said arranging the plurality of reflectors includes arranging the plurality of reflectors so that the plurality of optical resonator cavities are optically coupled in series with one another.

10. A method according to claim 1, further comprising making each of the plurality of optical resonator cavities a thin-film cavity.

11. A method according to claim 1, further comprising making each of the plurality of optical resonator cavities a thick-film cavity.

12. A method according to claim 1, wherein said arranging the plurality of reflectors includes arranging the plurality of reflectors so that at least one of the optical resonator cavities resonates simultaneously at the first wavelength and the second wavelength.

13. A method according to claim 1, wherein said locating the photoluminescent layer includes providing a phosphor layer.

14. A method according to claim 13, wherein said locating the phosphor layer includes providing a quantum-confining layer.

15. A method according to claim 14, wherein said providing the quantum-confining layer includes providing a II-VI semiconductor material layer.

16. A method according to claim 14, wherein said providing the quantum-confining layer includes providing a III-V semiconductor material layer.

17. A method according to claim 16, wherein said providing the quantum-confining layer includes providing a layer comprising indium gallium nitride.

18. A method according to claim 14, wherein said providing the quantum-confining layer includes providing at least one quantum well layer.

19. A method according to claim 14, wherein said providing the quantum-confining layer includes providing at least one quantum dot layer.

20. A method according to claim 1, wherein said providing the photoluminescent layer includes providing a photoluminescent layer having intentionally varying thickness selected so that the optical resonator outputs light at multiple wavelengths.

21. A method according to claim 1, wherein said arranging the plurality of reflectors includes arranging the plurality of reflectors so that at least one of the plurality of optical resonator cavities is tuned to produce an internal standing wave having antinode locations within that at least one of the plurality of optical resonator cavities, and said locating the photoluminescent layer includes locating at least one quantum-confining sub-layer at at least one of the antinode locations.

22. A method according to claim 21, wherein said locating the at least one quantum-confining sub-layer includes providing a quantum-well layer.

23. A method according to claim 21, further comprising providing a barrier layer between one of the plurality of reflectors and the at least one quantum-confining sub-layer, wherein the barrier layer participates as a component of that one of the plurality of reflectors.

24. A method according to claim 21, wherein said locating the at least one quantum-confining sub-layer includes providing a semiconductor material.

25. A method according to claim 21, wherein said locating the at least one quantum-confining sub-layer includes providing a II-IV semiconductor material.

26. A method according to claim 21, wherein said locating the at least one quantum-confining sub-layer includes providing a III-V semiconductor material.

27. A method according to claim 26, wherein said providing the III-V semiconductor material includes providing indium gallium nitride.

28. A method according to claim 1, further comprising providing the photoluminescent layer with a substantially uniform thickness selected to output photoluminescent light across a band of wavelengths having a width less than about 50 nm.

29. A method according to claim 1, further comprising providing the photoluminescent layer with a varying thickness selected to output photoluminescent light across a band of wavelengths having a width greater than about 50 nm.

30. A method according to claim 1, further comprising locating a plurality of photoluminescent layers, respectively, within the plurality of optical resonator cavities, wherein the plurality of photoluminescent layers have substantially the same thickness as one another.

31. A method according to claim 1, further comprising locating a plurality of photoluminescent layers, respectively, within the plurality of optical resonator cavities, wherein the plurality of photoluminescent layers have substantially different thicknesses relative to one another.

32. A method according to claim 1, further comprising providing a light source adjacent to at least one of the plurality of optical resonator cavities.

33. A method according to claim 1, further comprising forming the plurality of reflectors and the photoluminescent layer so that they are monolithic with one another.

34. A method according to claim 1, further comprising tuning the optical resonator system to output light equivalent in intensity and quality to the light output of a light emitting diode.

35. A method according to claim 1, further comprising tuning the optical resonator system to output light equivalent in intensity and quality to the light output of a visible-light emitting diode.

36. A method according to claim 1, further comprising tuning the optical resonator system to output light equivalent in intensity and quality to the light output of a green light emitting diode.

37. A method according to claim 1, further comprising tuning the optical resonator system to output light equivalent in intensity and quality to the light output of a laser diode.

38. A method according to claim 1, further comprising tuning the optical resonator system to output light equivalent in intensity and quality to the light output of a visible laser diode.

39. A method according to claim 1, further comprising tuning the optical resonator system to output light equivalent in intensity and quality to the light output of a green laser diode.

40. A method according to claim 1, further comprising tuning the optical resonator system to output light equivalent in intensity and quality to the light output of a polariton light emitting diode.

41. A method according to claim 1, further comprising tuning the optical resonator system to output light equivalent in intensity and quality to the light output of a polariton laser diode.

42. A method according to claim 1, further comprising tuning the optical resonator system to output light equivalent in intensity and quality to the light output of a vertical cavity surface emitting laser.

43. A method according to claim 1, further comprising configuring the plurality of optical resonator cavities so that ones of the plurality optical resonator cavities function, respectively, as a red downconverter, a green downconverter, and a blue downconverter.

44. A method according to claim 1, further comprising configuring the optical resonator system to output light of a first wavelength in response to receiving the input light of a second wavelength different from the first wavelength and to resonate at each of the first and second wavelengths simultaneously.

* * * * *